US008815494B2

(12) United States Patent
Shibayama et al.

(10) Patent No.: US 8,815,494 B2
(45) Date of Patent: *Aug. 26, 2014

(54) RESIST UNDERLAYER FILM FORMING COMPOSITION CONTAINING SILICON HAVING ANION GROUP

(71) Applicant: Nissan Chemical Industries, Ltd., Tokyo (JP)

(72) Inventors: Wataru Shibayama, Toyama (JP); Makoto Nakajima, Toyama (JP); Yuta Kanno, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/681,186

(22) Filed: Nov. 19, 2012

(65) Prior Publication Data

US 2013/0078814 A1 Mar. 28, 2013

Related U.S. Application Data

(62) Division of application No. 13/133,751, filed as application No. PCT/JP2009/070984 on Dec. 16, 2009.

(30) Foreign Application Priority Data

Dec. 19, 2008 (JP) .................................. 2008-323816

(51) Int. Cl.
| | | |
|---|---|---|
| G03F 7/20 | (2006.01) | |
| G03F 7/09 | (2006.01) | |
| H01L 21/308 | (2006.01) | |
| G03F 7/075 | (2006.01) | |
| C09D 183/04 | (2006.01) | |
| G03F 7/11 | (2006.01) | |
| C08L 83/04 | (2006.01) | |

(52) U.S. Cl.
CPC ............ *H01L 21/3086* (2013.01); *G03F 7/091* (2013.01); *G03F 7/0752* (2013.01); *C09D 183/04* (2013.01); *G03F 7/11* (2013.01); *C08L 83/04* (2013.01)
USPC ......................................................... 430/313

(58) Field of Classification Search
USPC ................................................. 430/311, 313
See application file for complete search history.

(56) References Cited

U.S. PATENT DOCUMENTS

| | | | |
|---|---|---|---|
| 3,813,364 A | 5/1974 | De Zuba et al. | |
| 5,100,503 A | 3/1992 | Allman et al. | |
| 5,152,834 A | 10/1992 | Allman | |
| 5,209,775 A | 5/1993 | Bank et al. | |
| 5,302,198 A | 4/1994 | Allman | |
| 5,472,488 A | 12/1995 | Allman | |
| 5,527,872 A | 6/1996 | Allman | |
| 5,665,845 A | 9/1997 | Allman | |
| 5,962,188 A | 10/1999 | DeBoer et al. | |
| 6,576,393 B1 | 6/2003 | Sugita et al. | |
| 7,192,683 B2 | 3/2007 | Yamasaki et al. | |
| 2004/0253461 A1 | 12/2004 | Ogihara et al. | |
| 2004/0266925 A1 | 12/2004 | Shiono | |
| 2006/0003252 A1 | 1/2006 | Hirayama et al. | |
| 2006/0093959 A1 | 5/2006 | Huang et al. | |
| 2007/0190459 A1 | 8/2007 | Hashimoto et al. | |
| 2007/0224816 A1* | 9/2007 | Uh et al. ....................... 438/689 |
| 2008/0076059 A1 | 3/2008 | Abdallah et al. | |
| 2008/0107997 A1 | 5/2008 | Hiroi et al. | |
| 2008/0312400 A1 | 12/2008 | Yamashita et al. | |
| 2009/0050020 A1 | 2/2009 | Konno et al. | |
| 2009/0130594 A1 | 5/2009 | Takei et al. | |
| 2009/0148789 A1* | 6/2009 | Amara et al. .............. 430/270.1 |
| 2009/0162782 A1 | 6/2009 | Takei et al. | |
| 2010/0151384 A1 | 6/2010 | Konno et al. | |
| 2010/0304305 A1 | 12/2010 | Nakajima et al. | |
| 2010/0330505 A1 | 12/2010 | Nakajima et al. | |
| 2011/0143149 A1 | 6/2011 | Shibayama et al. | |
| 2011/0287369 A1 | 11/2011 | Shibayama et al. | |
| 2012/0070994 A1 | 3/2012 | Kanno et al. | |
| 2012/0178261 A1 | 7/2012 | Kanno et al. | |
| 2012/0315765 A1 | 12/2012 | Nakajima et al. | |

FOREIGN PATENT DOCUMENTS

| | | |
|---|---|---|
| EP | 0 260 976 A2 | 3/1988 |
| EP | 1 798 599 A1 | 6/2007 |
| EP | 1 855 159 A1 | 11/2007 |
| EP | 2 249 204 A1 | 11/2010 |
| JP | A-54-123965 | 9/1979 |
| JP | A-05-027444 | 2/1993 |

(Continued)

OTHER PUBLICATIONS

Mar. 9, 2010 International Search Report issued in International Patent Application No. PCT/JP2009/070984.
May 8, 2012 Search Report issued in European Patent Application No. 09833458.4.
U.S. Appl. No. 13/133,751, filed Aug. 4, 2011.
Mar. 10, 2009 International Search Report issued in Application No. PCT/JP2009/052535.
Nov. 2, 2009 International Search Report issued in international Application No. PCT/JP2009/064301.

(Continued)

*Primary Examiner* — Brittany Raymond
(74) *Attorney, Agent, or Firm* — Oliff PLC

(57) ABSTRACT

There is provided a method of making a semiconductor device utilizing a resist underlayer film forming composition comprising a silane compound containing an anion group, wherein the silane compound containing an anion group is a hydrolyzable organosilane in which an organic group containing an anion group is bonded to a silicon atom and the anion group forms a salt structure, a hydrolysis product thereof, or a hydrolysis-condensation product thereof. The anion group may be a carboxylic acid anion, a phenolate anion, a sulfonic acid anion, or a phosphonic acid anion. The hydrolyzable organosilane may be a compound of Formula (1): $R^1_a R^2_b Si(R^3)_{4-(a+b)}$ (1).

2 Claims, No Drawings

(56) References Cited

FOREIGN PATENT DOCUMENTS

| | | |
|---|---|---|
| JP | A-05-311158 | 11/1993 |
| JP | A-05-333292 | 12/1993 |
| JP | A-06-001796 | 1/1994 |
| JP | A-06-228459 | 8/1994 |
| JP | A-08-053560 | 2/1996 |
| JP | A-10-209134 | 8/1998 |
| JP | A-10-510860 | 10/1998 |
| JP | A-11-012544 | 1/1999 |
| JP | A-11-258813 | 9/1999 |
| JP | A-2000-282014 | 10/2000 |
| JP | A-2001-093824 | 4/2001 |
| JP | A-2001-294810 | 10/2001 |
| JP | A-2004-276603 | 10/2004 |
| JP | A-2005-070776 | 3/2005 |
| JP | A-2005-255858 | 9/2005 |
| JP | A-2006-182688 | 7/2006 |
| JP | A-2006-272588 | 10/2006 |
| JP | A-2007-031627 | 2/2007 |
| JP | A-2007-81133 | 3/2007 |
| JP | A-2007-241259 | 9/2007 |
| JP | A-2007-258622 | 10/2007 |
| JP | A-2008-038131 | 2/2008 |
| JP | A-2008-519297 | 6/2008 |
| JP | A-2008-213177 | 9/2008 |
| JP | A-2008-309929 | 12/2008 |
| JP | A-2009-244722 | 10/2009 |
| WO | WO 96/18918 | 6/1996 |
| WO | WO 98/28366 A1 | 7/1998 |
| WO | WO 00/01752 A1 | 1/2000 |
| WO | WO 2004/055598 A1 | 7/2004 |
| WO | WO 2005/088398 A1 | 9/2005 |
| WO | WO 2006/093057 A1 | 9/2006 |
| WO | WO 2007/066597 A1 | 6/2007 |
| WO | WO 2008/038863 A1 | 4/2008 |
| WO | WO 2009/034998 A1 | 3/2009 |
| WO | WO 2009/041511 A1 | 4/2009 |
| WO | WO 2009/104552 A1 | 8/2009 |
| WO | WO 2009/111121 A2 | 9/2009 |
| WO | WO 2009/111122 A2 | 9/2009 |

OTHER PUBLICATIONS

Jun. 22, 2010 Written Opinion of ISA issued in International Patent Application No. PCT/JP2010/059117 (translation).
Jun. 22, 2010 International Search Report issued in International Patent Application No. PCT/JP2010/059117.
Oct. 19, 2010 International Search Report issued in International Patent Application No. PCT/JP2010/065307.
May 24, 2011 Translation of the Written Opinion issued in PCT/JP2011/053525.
May 24, 2011 Translation of the International Search Report issued in PCT/JP2011/053525.
Jun. 7, 2012 Office Action issued in U.S. Appl. No. 12/867,587.
Mar. 21, 2013 Final Rejection issued in U.S. Appl. No. 12/867,587.
Dec. 9, 2011 European Search Report issued in Application No. 09712238.6.
U.S. Appl. No. 12/867,587, filed Aug. 13, 2010.
U.S. Appl. No. 13/681,186, filed Nov. 19, 2012.
U.S. Appl. No. 13/375,517, filed Dec. 1, 2011.
U.S. Appl. No. 13/496,768, filed Mar. 16, 2012.
U.S. Appl. No. 13/580,066, filed Aug. 20, 2012.
U.S. Appl. No. 13/058,109, filed Feb. 8, 2011.
Office Action dated Feb. 7, 2013 from U.S. Appl. No. 13/133,751.
U.S. Office Action dated Oct. 4, 2013 from U.S. Appl. No. 13/058,109.
U.S. Office Action dated Nov. 29, 2013 from U.S. Appl. No. 13/375,517.
U.S. Office Action dated Dec. 3, 2013 from U.S. Appl. No. 13/580,066.
Office Action cited in U.S. Appl. No. 13/496,768 on Jan. 3, 2014.
Office Action cited in U.S. Appl. No. 13/133.751 on Dec. 26, 2013.
Notice of Examination Opinion and Search Report dated Feb. 6, 2014 from Taiwanese Patent Application No. 098143678 (with English-language translation).
U.S. Office Action dated May 1, 2014 from U.S. Appl. No. 13/580,066.

* cited by examiner

RESIST UNDERLAYER FILM FORMING COMPOSITION CONTAINING SILICON HAVING ANION GROUP

This is a Division of U.S. application Ser. No. 13/133,751 filed Aug. 4, 2011, which in turn is a National Phase of Application No. PCT/JP2009/070984 filed Dec. 16, 2009, which claims the benefit of Japanese Application No. 2008-323816 filed Dec. 19, 2008. Each of the disclosures of the prior applications is hereby incorporated by reference herein in its entirety.

TECHNICAL FIELD

The present invention relates to a composition for forming an underlayer film between a substrate and a resist (such as a photoresist and an electron beam resist) used for the production of semiconductor devices. More in detail, the present invention relates to resist underlayer film forming composition for lithography for forming an underlayer film used as an underlayer of a photoresist in a lithography process of the production of semiconductor devices. The present invention also relates to a forming method of a resist pattern using the underlayer film forming composition.

BACKGROUND ART

Conventionally, in the production of semiconductor devices, fine processing by lithography using a photoresist has been performed. The fine processing is a processing method for forming fine convexo-concave shapes corresponding to the following pattern on the surface of a substrate by: forming a thin film of a photoresist on a semiconductor substrate such as a silicon wafer; irradiating the resultant thin film with an active ray such as an ultraviolet ray through a mask pattern in which a pattern of a semiconductor device is depicted for development; and subjecting the substrate to etching processing using the resultant photoresist pattern as a protecting film. Recently, however, the high integration of semiconductor devices has progressed and the adopted active ray tends to have a shorter wavelength, such as an ArF excimer laser (193 nm) replacing a KrF excimer laser (248 nm). Following such a tendency, the influence of reflection of an active ray on a semiconductor substrate has become a large problem. Thus, in order to solve this problem, widely studied is a method of providing a bottom anti-reflective coating between the photoresist and the substrate. For such a bottom anti-reflective coating, many investigations on an organic bottom anti-reflective coating composed of a polymer having a light absorbing group and the like are performed due to easiness of its use and so on. Examples of the bottom anti-reflective coating include: an acrylic resin-based bottom anti-reflective coating having both a hydroxy group as a crosslinkable group and a light absorbing group within a single molecule; and a novolac resin-based bottom anti-reflective coating having both a hydroxy group as a crosslinkable group and a light absorbing group within a single molecule.

Characteristics required for the bottom anti-reflective coating include a large absorbance to light or radiation, no intermixing with a photoresist (being insoluble in a photoresist solvent), no diffusion of low molecule substances from the bottom anti-reflective coating to the photoresist as an upper layer during heating-baking, a dry etching rate higher than that of the photoresist, and the like.

Used as an underlayer film between the semiconductor substrate and the photoresist is a film known as a hardmask containing a metal element such as silicon and titanium. In this case, the resist and the hardmask have components largely different from each other, so that the removal rates of the resist and the hardmask by dry etching largely depend on the type of a gas used for dry etching. Then, by appropriately selecting the type of a gas, the hardmask can be removed by dry etching without a large decrease in the film thickness of the photoresist. Thus, in the production of semiconductor devices in recent years, for achieving various effects such as the reflection preventing effect, resist underlayer film is disposed between the semiconductor substrate and the photoresist. Although the studies of a composition for a resist underlayer film have been performed, the development of a novel material for the resist underlayer film is desired due to the diversity of characteristics required and so on. As one of such materials, there is mentioned a polysiloxane.

There is disclosed a silica-based coating film forming composition containing a polysiloxane, a solvent, and acyclic basic compound (Patent Document 1).

On the other hand, it is known that a polysiloxane has organic groups and the organic group is substituted with various functional groups to exert functions thereof. For example, there is disclosed a coating composition using a polysiloxane having a sulfonic acid group as a hydrophilic group and having reflection preventing characteristics and clouding preventing characteristics (Patent Document 2).

RELATED-ART DOCUMENT

Patent Document

Patent Document 1: Japanese Patent Application Publication No. JP-A-2007-081133
Patent Document 2: Japanese Translation of PCT International Application No. JP-A-10-510860

DISCLOSURE OF THE INVENTION

Problem to be Solved by the Invention

It is an object of the present invention to provide a resist underlayer film forming composition for lithography capable of being used in the production of a semiconductor device. More in detail, it is an object of the present invention to provide a resist under layer film forming composition for lithography for forming a resist underlayer film capable of being used as a hardmask. In addition, it is an object of the present invention to provide a resist underlayer film forming composition for lithography for forming a resist underlayer film capable of being used as a bottom anti-reflective coating. Further, it is an object of the present invention to provide a resist underlayer film for lithography causing no intermixing with a resist and having a dry etching rate higher than that of the resist, and a resist underlayer film forming composition for forming the underlayer film.

It is another object of the present invention to provide a production method of a semiconductor device using the resist underlayer film forming composition for lithography.

Means for Solving the Problem

The present invention provides: according to a first aspect, a resist underlayer film forming composition for lithography containing a silane compound containing an anion group, in which the silane compound containing an anion group is a hydrolyzable organosilane in which an organic group containing an anion group is bonded to a silicon atom and the anion group forms a salt structure, a hydrolysis product thereof, or a hydrolysis-condensation product thereof;

according to a second aspect, the composition according to claim 1, in which the composition includes the silane compound containing an anion group and a silane compound containing no anion group, and among both silane compounds, the silane compound containing an anion group exists in a ratio of less than 1 mol %;

according to a third aspect, the composition according to claim 1, in which the composition includes the silane compound containing an anion group and a silane compound containing no anion group, and among both silane compounds, the silane compound containing an anion group exists in a ratio of 0.01 to 0.95 mol %;

according to a fourth aspect, the composition according to any one of claims 1 to 3, in which the anion group is a carboxylic acid anion, a phenolate anion, a sulfonic acid anion, or a phosphonic acid anion;

according to a fifth aspect, the composition according to any one of claims 1 to 4, in which the hydrolyzable organosilane is represented by Formula (1):

$$R^1{}_a R^2{}_b Si(R^3)_{4-(a+b)} \quad \text{Formula (1)}$$

(where $R^1$ is an anion group or an organic group containing an anion group and is bonded to a silicon atom through a Si—C bond; $R^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group and is bonded to a silicon atom through a Si—C bond; $R^3$ is an alkoxy group, an acyloxy group, or a halogen group; a is an integer of 1 or 2; b is an integer of 0 or 1; and a+b is an integer of 1 or 2);

according to a sixth aspect, the composition according to claim 5, containing a mixture of the hydrolyzable organosilane of Formula (1) and at least one organic silicon compound selected from a group consisting of a compound of Formula (2):

$$R^4{}_a Si(R^5)_{4-a} \quad \text{Formula (2)}$$

(where $R^4$ is an alkyl group, an aryl group, a halogenated alkyl group, a halogenated aryl group, an alkenyl group, or an organic group having an epoxy group, an acryloyl group, a methacryloyl group, a mercapto group, or a cyano group and is bonded to a silicon atom through a Si—C bond; $R^5$ is an alkoxy group, an acyloxy group, or a halogen group; and a is an integer of 0 to 3) and a compound of Formula (3):

$$[R^6{}_c Si(R^7)_{3-c}]_2 Y_b \quad \text{Formula (3)}$$

(where $R^6$ is an alkyl group and is bonded to a silicon atom through a Si—C bond; $R^7$ is an alkoxy group, an acyloxy group, or a halogen group; Y is an alkylene group or an arylene group; b is an integer of 0 or 1; and c is an integer of 0 or 1), a hydrolysis product of the mixture, or a hydrolysis-condensation product of the mixture;

according to a seventh aspect, the composition according to claim 5 or 6, containing, as a polymer, the compound of Formula (1) or the hydrolysis-condensation product of the compound of Formula (1) and the compound of Formula (2);

according to an eighth aspect, the composition according to any one of claims 1 to 7, further containing an acid as a hydrolysis catalyst;

according to a ninth aspect, the composition according to any one of claims 1 to 8, further containing water;

according to a tenth aspect, a resist underlayer film obtained by applying the resist underlayer film forming composition as described in any one of claims 1 to 9 onto a semiconductor substrate and baking the composition;

according to an eleventh aspect, a production method of a semiconductor device including a process of applying the resist underlayer film forming composition as described in any one of claims 1 to 9 onto a semiconductor substrate and baking the composition to form a resist underlayer film, a process of applying a composition for a resist onto the resist underlayer film to form a resist film, a process of exposing the resist film to light, a process of developing the resist after the exposure to obtain a resist pattern, a process of etching the resist underlayer film using the resist pattern as a protecting film, and a process of processing the semiconductor substrate using the patterned resist and the patterned resist underlayer film; and according to a twelfth aspect, a production method of a semiconductor device including a process of forming an organic underlayer film on a semiconductor substrate, a process of applying the resist underlayer film forming composition as described in any one of claims 1 to 9 on the organic underlayer film and baking the composition to form a resist underlayer film, a process of applying a composition for a resist onto the resist underlayer film to form a resist film, a process of exposing the resist film to light, a process of developing the resist after the exposure to obtain a resist pattern, a process of etching the resist underlayer film according to the resist pattern, a process of etching the organic underlayer film using the patterned resist underlayer film as a protecting film, and a process of processing the semiconductor substrate using the patterned organic underlayer film as a protecting film.

Effects of the Invention

The resist underlayer film forming composition for lithography of the present invention can be used as a hardmask, and further, as a bottom anti-reflective coating for the organic underlayer film or the substrate existing as an underlayer thereof during dry etching. The resist underlayer film for lithography of the present invention causes no intermixing with a resist and has a dry etching rate larger than that of a resist in dry etching using a halogen-containing gas. Further, by a production method of semiconductor devices using the resist underlayer film for lithography of the present invention, a semiconductor device in which a fine circuit pattern is formed can be obtained.

BEST MODES FOR CARRYING OUT THE INVENTION

The present invention is a resist underlayer film forming composition for lithography containing a hydrolyzable organosilane in which an organic group containing an anion group is bonded to a silicon atom and the anion group forms a salt structure, a hydrolysis product thereof, or a hydrolysis-condensation product thereof.

These hydrolyzable silane, hydrolysis product thereof, and hydrolysis-condensation product thereof can also be used in combination. The hydrolyzable silane is hydrolyzed and the obtained hydrolysis product can be condensed to be used as a condensation product. A partial hydrolysis product as a result of an incomplete hydrolysis when obtaining a hydrolysis-condensation product or a mixture of a hydrolysis-condensation product with a silane compound can also be used. The condensation product is a polymer having a polysiloxane structure. To this polysiloxane, an anion group or an organic group containing an anion group is bonded.

The resist underlayer film forming composition of the present invention contains a hydrolyzable organosilane in which an organic group containing an anion group is bonded to a silicon atom and the anion group forms a salt structure, a hydrolysis product thereof, or a hydrolysis-condensation product thereof and a solvent. Then, the composition of the present invention may contain, as optional components, an acid, water, an alcohol, a curing catalyst, an acid generator, other organic polymers, a light-absorptive compound, a surfactant, and the like.

The solid content of the resist underlayer film forming composition of the present invention is, for example, 0.5 to 50% by mass, 1 to 30% by mass, or 1 to 25% by mass. Here, the solid content is a component remaining after subtracting a solvent component from the whole component of the film (resist underlayer film) forming composition.

The ratio constituted by the hydrolyzable organosilane, a hydrolysis product thereof, and a hydrolysis-condensation product thereof in the solid content is 20% by mass or more, for example 50 to 100% by mass, 60 to 100% by mass, or 70 to 100% by mass.

Examples of the anion group include a carboxylic acid anion, a phenolate anion, a sulfonic acid anion, and a phosphonic acid anion.

The hydrolyzable organosilane used in the present invention has a structure of Formula (1).

In Formula (1), $R^1$ is an anion group or an organic group containing an anion group and is bonded to a silicon atom through a Si—C bond. $R^2$ is an alkyl group, an aryl group, a halogenated alkyl group, a halogenated aryl group, an alkenyl group, or an organic group having an epoxy group, an acryloyl group, a methacryloyl group, a mercapto group, or a cyano group and is bonded to a silicon atom through a Si—C bond. $R^3$ is an alkoxy group, an acyloxy group, or a halogen group. a is an integer of 1 or 2. b is an integer of 0 or 1. a+b is an integer of 1 or 2.

In $R^2$ of Formula (1), the alkyl group is a linear or branched $C_{1-10}$ alkyl group and examples of the alkyl group include a methyl group, an ethyl group, an n-propyl group, an isopropyl group, an n-butyl group, an isobutyl group, a sec-butyl group, a tert-butyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, and a 1-ethyl-2-methyl-n-propyl group.

As the alkyl group, a cyclic alkyl group can also be used and examples of the cyclic alkyl group include $C_{1-10}$ cyclic alkyl groups such as a cyclopropyl group, a cyclobutyl group, a 1-methyl-cyclopropyl group, 2-methyl-cyclopropyl group, a cyclopentyl group, a 1-methyl-cyclobutyl group, a 2-ethyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-isopropyl-cyclopropyl group, a 2-isopropyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the aryl group include $C_{6-20}$ aryl groups such as a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-mercaptophenyl group, an o-methoxyphenyl group, a p-methoxyphenyl group, a p-aminophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Examples of the alkenyl group include $C_{2-10}$ alkenyl groups such as an ethenyl group, a 1-propenyl group, a 2-propenyl group, a 1-ethyl-1-ethenyl group, a 1-butenyl group, a 2-butenyl group, a 3-butenyl group, a 2-methyl-1-propenyl group, a 2-methyl-2-propenyl group, a 1-ethyl ethenyl group, a 1-methyl-1-propenyl group, a 1-methyl-2-propenyl group, a 1-pentenyl group, a 2-pentenyl group, a 3-pentenyl group, a 4-pentenyl group, a 1-n-propyl ethenyl group, a 1-ethyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-isopropyl ethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butyl ethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-sec-butyl ethenyl group, a 1,3-dimethyl-1-butenyl group, a 1,3-dimethyl-2-butenyl group, a 1,3-dimethyl-3-butenyl group, a 1-isobutyl ethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-isopropyl-2-propenyl group, a 3,3-dimethyl-1-butenyl group, a 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-tert-butyl ethenyl group, a 1-methyl-1-ethyl-2-propenyl group, a 1-ethyl-2-methyl-1-propenyl group, a 1-ethyl-2-methyl-2-propenyl group, a 1-isopropyl-1-propenyl group, a 1-isopropyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-ethyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

The above-mentioned groups may be organic groups substituted with a halogen atom such as fluorine, chlorine, bromine, and iodine.

Examples of the organic group having an epoxy group include a glycidoxymethyl group, a glycidoxyethyl group, a glyeidoxypropyl group, a glycidoxybutyl group, and an epoxycyclohexyl group.

Examples of the organic group haying an acryloyl group include an acryloylmethyl group, an acryloylethyl group, and an acryloylpropyl group.

Examples of the organic group having a methacryloyl group include a methacryloylmethyl group, a methacryloylethyl group, and a methacryloylpropyl group.

Examples of the organic group having a mercapto group include an ethylmercapto group, a butylmercapto group, a hexylmercapto group, and an octylmercapto group.

Examples of the organic group having a cyano group include a cyanoethyl group and a cyanopropyl group.

Examples of the $C_{1-20}$ alkoxy group as $R^3$ in Formula (1) include $C_{1-20}$ alkoxy groups having a linear, branched, or cyclic alkyl portion such as a methoxy group, an ethoxy group, an n-propoxy group, an isopropoxy group, an n-butoxy group, an isobutoxy group, a sec-butoxy group, a tert-butoxy group, an n-pentyloxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, an n-hexyloxy group, a 1-methyl-n-pentyloxy group, a 2-methyl-n-pentyloxy group, a 3-methyl-n-pentyloxy group, a 4-methyl-n-pentyloxy group, a 1,1-dimethyl-n-butoxy group, a 1,2-dimethyl-n-butoxy group, a 1,3-dimethyl-n-butoxy group, a 2,2-dimethyl-n-butoxy group, a 2,3-dimethyl-n-butoxy group, a 3,3-dimethyl-n-butoxy group, a 1-ethyl-n-butoxy group, a 2-ethyl-n-butoxy group, a 1,1,2-trimethyl-n-propoxy group, a 1,2,2-trimethyl-n-propoxy group, a 1-ethyl-1-methyl-n-propoxy group, and a 1-ethyl-2-methyl-n-propoxy group. Examples of the cyclic alkoxy group as $R^3$ include a cyclopropoxy group, a cyclobutoxy group, a 1-methyl-cyclopropoxy group, a 2-methyl-cyclopropoxy group, a cyclopentyloxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, a 2-ethyl-cyclopropoxy group, a cyclohexyloxy group, a 1-methyl-cyclopentyloxy group, a 2-methyl-cyclopentyloxy group, a 3-methyl-cyclopentyloxy group, a 1-ethyl-cyclobutoxy group, a 2-ethyl-cyclobutoxy group, a 3-ethyl-cyclobutoxy group, a 1,2-dimethyl-cyclobutoxy group, a 1,3-dimethyl-cyclobutoxy group, a 2,2-dimethyl-cyclobutoxy group, a 2,3-dimethyl-cyclobutoxy group, a 2,4-dimethyl-cyclobutoxy group, a 3,3-dimethyl-cyclobutoxy group, a 1-n-propyl-cyclopropoxy group, a 2-n-propyl-cyclopropoxy group, a 1-isopropyl-cyclopropoxy group, a 2-isopropyl-cyclopropoxy group, a 1,2,2-trimethyl-cyclopropoxy group, a 1,2,3-trimethyl-cyclopropoxy group, a 2,2,3-trimethyl-cyclopropoxy group, a 1-ethyl-2-methyl-cyclopropoxy group, a 2-ethyl-1-methyl-cyclopropoxy group, a 2-ethyl-2-methyl-cyclopropoxy group, and a 2-ethyl-3-methyl-cyclopropoxy group.

Examples of the $C_{1-20}$ acyloxy group as $R^3$ in Formula (1) include a methylcarbonyloxy group, an ethylcarbonyloxy group, an n-propylcarbonyloxy group, an isopropylcarbonyloxy group, an n-butylcarbonyloxy group, an isobutylcarbonyloxy group, a sec-butylcarbonyloxy group, a tert-butylcarbonyloxy group, an n-pentylcarbonyloxy group, a 1-methyl-n-butylcarbonyloxy group, a 2-methyl-n-butylcarbonyloxy group, a 3-methyl-n-butylcarbonyloxy group, a 1,1-dimethyl-n-propylcarbonyloxy group, a 1,2-dimethyl-n-propylcarbonyloxy group, a 2,2-dimethyl-n-propylcarbonyloxy group, a 1-ethyl-n-propylcarbonyloxy group, an n-hexylcarbonyloxy group, a 1-methyl-n-pentylcarbonyloxy group, a 2-methyl-n-pentylcarbonyloxy group, a 3-methyl-n-pentylcarbonyloxy group, a 4-methyl-n-pentylcarbonyloxy group, a 1,1-dimethyl-n-butylcarbonyloxy group, a 1,2-dimethyl-n-butylcarbonyloxy group, a 1,3-dimethyl-n-butylcarbonyloxy group, a 2,2-dimethyl-n-butylcarbonyloxy group, a 2,3-dimethyl-n-butylcarbonyloxy group, a 3,3-dimethyl-n-butylcarbonyloxy group, a 1-ethyl-n-butylcarbonyloxy group, a 2-ethyl-n-butylcarbonyloxy group, a 1,1,2-trimethyl-n-propylcarbonyloxy group, a 1,2,2-trimethyl-n-propylcarbonyloxy group, a 1-ethyl-1-methyl-n-propylcarbonyloxy group, a 1-ethyl-2-methyl-n-propylcarbonyloxy group, a phenylcarbonyloxy group, and a tosylcarbonyloxy group.

Examples of the halogen group as $R^3$ in Formula (1) include fluorine, chlorine, bromine, and iodine.

As the hydrolyzable organosilane of Formula (1), commercial products may be used.

$R^1$ in Formula (1) is an anion group or an organic group containing an anion group. Examples of the anion group include a carboxylic acid group, a sulfonic acid group, a phenolate group, a quaternary boron group, an imide group, and a carbanion group and among them, preferably used are a carboxylic acid group, a phenol group, and a sulfonic acid group. Examples of such anions include the anions below.

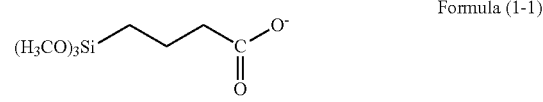

Formula (1-1)

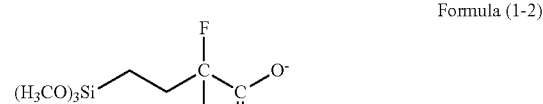

Formula (1-2)

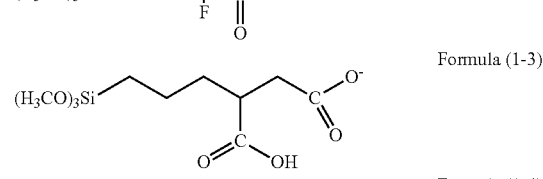

Formula (1-3)

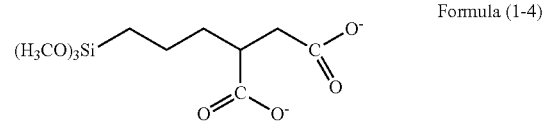

Formula (1-4)

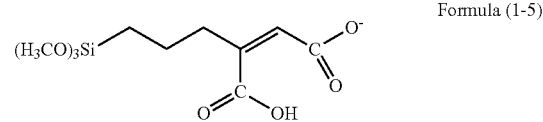

Formula (1-5)

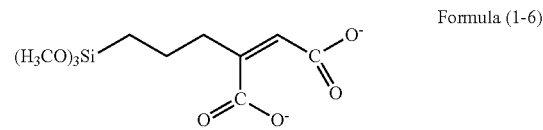

Formula (1-6)

-continued (H₃CO)₃Si-(CH₂)₃-C₆H₄-COO⁻  Formula (1-7)

(H₃CO)₃Si-(CH₂)₃-C₆H₃(OH)-COO⁻  Formula (1-8)

(H₃CO)₃Si-(CH₂)₃-SO₃⁻  Formula (1-9)

(H₃CO)₃Si-CH₂-CF₂-SO₃⁻  Formula (1-10)

(H₃CO)₃Si-(CH₂)₂-O-SO₃⁻  Formula (1-11)

(H₃CO)₃Si-CH₂-CF₂-O-SO₃⁻  Formula (1-12)

(H₃CO)₃Si-(CH₂)₃-C₆H₄-O⁻  Formula (1-13)

(H₃CO)₃Si-(CH₂)₃-C₆H₃(OH)-O⁻  Formula (1-14)

(H₃CO)₃Si-(CH₂)₃-P(=O)(OH)(O⁻)  Formula (1-15)

(H₃CO)₃Si-(CH₂)₃-P(=O)(O⁻)₂  Formula (1-16)

(H₃CO)₃Si-(CH₂)₃-BF₃⁻  Formula (1-17)

(H₃CO)₃Si-(CH₂)₃-SO₂-N⁻-C(=O)-CH₃  Formula (1-18)

(H₃CO)₃Si-(CH₂)₃-SO₂-N⁻-C(=O)-CF₃  Formula (1-19)

(H₃CO)₃Si-(CH₂)₃-SO₂-N⁻-SO₂-CH₃  Formula (1-20)

(H₃CO)₃Si-(CH₂)₃-SO₂-N⁻-SO₂-CF₃  Formula (1-21)

(H₃CO)₃Si-CH₂-CF₂-SO₂-N⁻-SO₂-CF₃  Formula (1-22)

(H₃CO)₃Si-CH₂-CF₂-SO₂-N⁻-SO₂-C₂F₅  Formula (1-23)

(H₃CO)₃Si-(CH₂)₃-SO₂-C⁻(SO₂CF₃)₂  Formula (1-24)

(H₃CO)₃Si-CH₂-CF₂-SO₂-C⁻(SO₂CF₃)₂  Formula (1-25)

(H₃CO)₃Si-(CH₂)₃-N⁻-SO₂-CH₃  Formula (1-26)

(H₃CO)₃Si-(CH₂)₃-N⁻-SO₂-CF₃  Formula (1-27)

(H₃CO)₃Si-(CH₂)₃-N⁻-SO₂-C₆H₅  Formula (1-28)

(H₃CO)₃Si-(CH₂)₃-N⁻-SO₂-C₆F₅  Formula (1-29)

Formula (1-30)

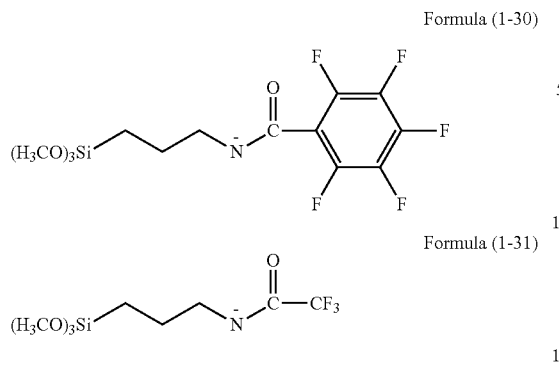

Formula (1-31)

Examples of the counter cation of a hydrolyzable silane having such anion groups include an ammonium cation, a phosphonium cation, a sulfonium cation, and an iodonium cation. Examples of these cations include the cations below. R is a hydrogen atom, an alkyl group, an alkenyl group, an aryl group, or a combination thereof. Examples of the alkyl group, of the alkenyl group, and of the aryl group include the above exemplified groups respectively.

Formula (2-1)

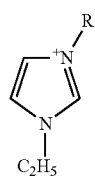

Formula (2-2)

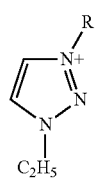

Formula (2-3)

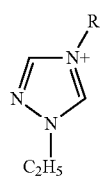

Formula (2-4)

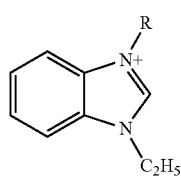

Formula (2-5)

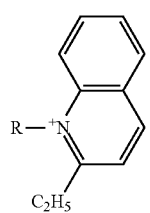

Formula (2-6)

Formula (2-7)

Formula (2-8)

Formula (2-9)

Formula (2-10)

Formula (2-11)

Formula (2-12)

Formula (2-13)

Formula (2-14)

Formula (2-15)

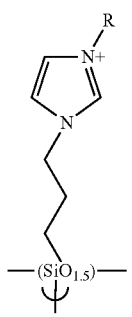
Formula (2-16)
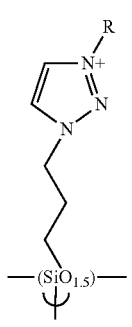
Formula (2-17)
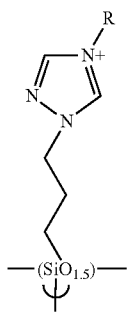
Formula (2-18)
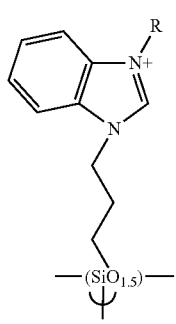
Formula (2-19)
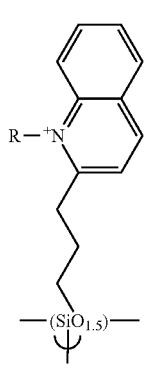
Formula (2-20)
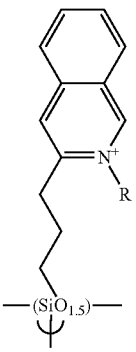
Formula (2-21)
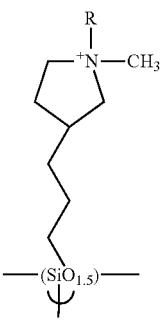
Formula (2-22)
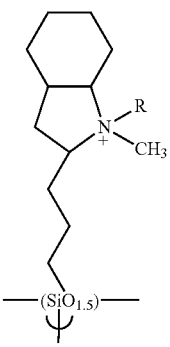
Formula (2-23)
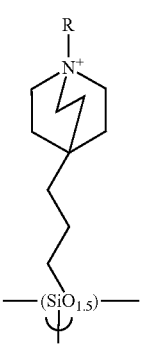
Formula (2-24)
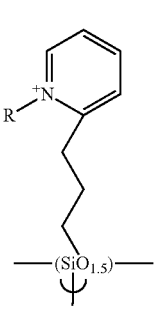
Formula (2-25)

-continued
Formula (2-26)
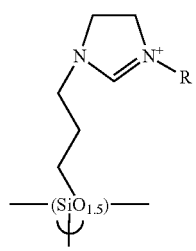
Formula (2-27)
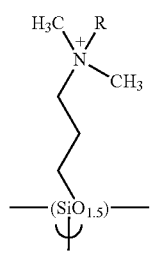
Formula (2-28)
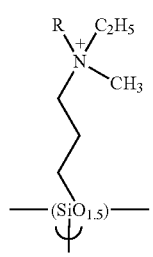
Formula (2-29)
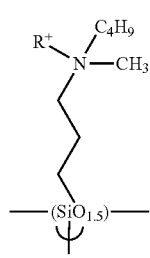
Formula (2-30)
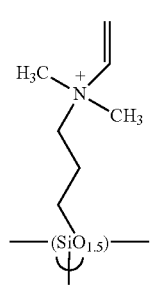
Formula (2-31)
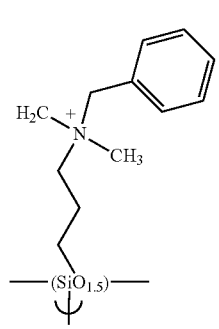
Formula (2-32)
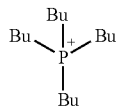
Formula (2-33)
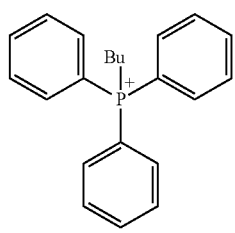
Formula (2-34)
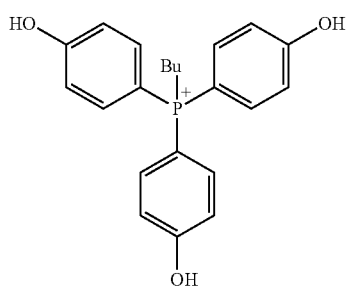
Formula (2-35)
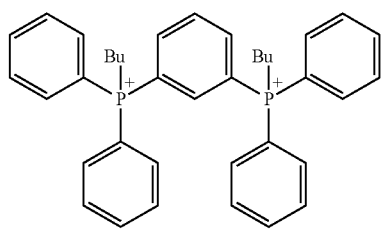
Formula (2-36)
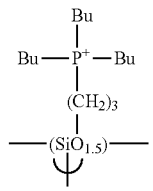
Formula (2-37)
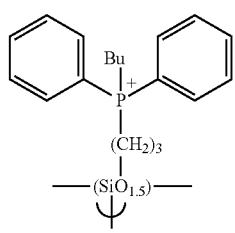
Formula (2-38)
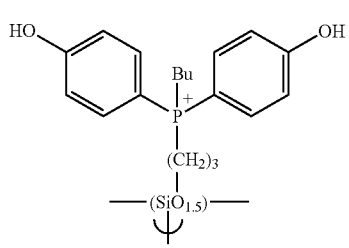

Formula (2-39)
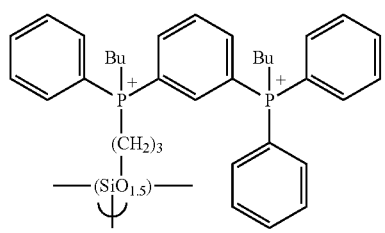
Formula (2-40)
Formula (2-41)
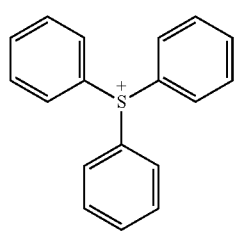
Formula (2-42)
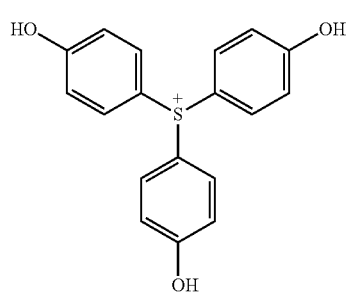
Formula (2-43)
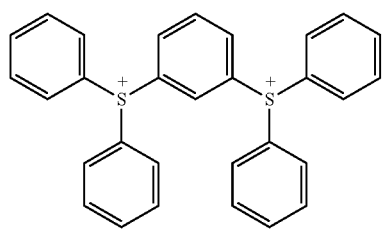
Formula (2-44)
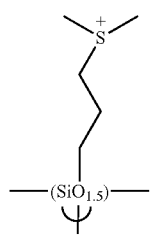
Formula (2-45)
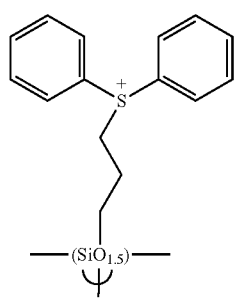
Formula (2-46)
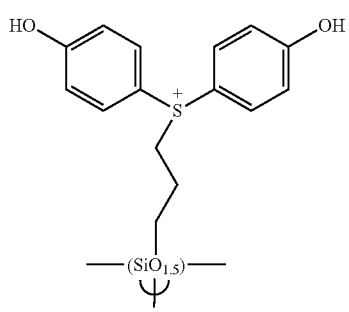
Formula (2-47)
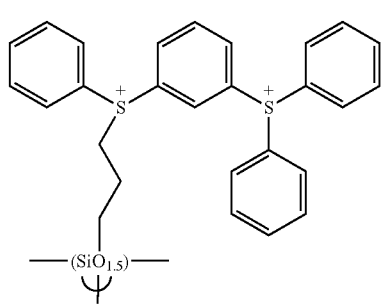
Formula (2-48)
Formula (2-49)
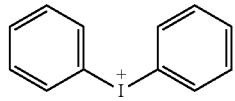
Formula (2-50)
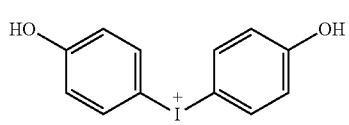
Formula (2-51)
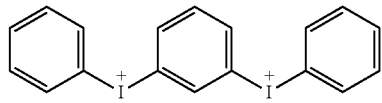
Formula (2-52)
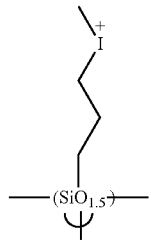
Formula (2-53)
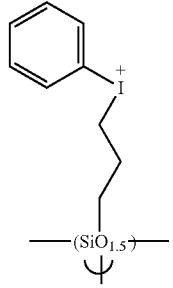

-continued

Formula (2-54)

Formula (2-55)

In the present invention, the hydrolyzable organosilane of Formula (1) and at least one silicon-containing compound selected from a group of Formula (2) and Formula (3) can be used in combination.

That is, the hydrolyzable organosilane of Formula (1), a hydrolysis product thereof, or a hydrolysis-condensation product thereof and at least one silicon-containing compound selected from a group of Formula (2) and Formula (3), a hydrolysis product thereof, or a hydrolysis-condensation product thereof can be used in combination.

The hydrolyzable organosilane of Formula (1) and the silicon-containing compound of Formula (2) and/or Formula (3) can be used in a molar ratio in a range of 1:0 to 1:1000. As the silicon-containing compound selected from a group consisting of Formula (2) and Formula (3), the silicon-containing compound of Formula (2) is preferably used.

These are preferably used as a hydrolysis-condensation product (polyorganosiloxane), and a hydrolysis-condensation product (polyorganosiloxane) of the hydrolyzable organosilane of Formula (1) with the silicon-containing compound of Formula (2) is preferably used.

Examples of the alkyl group, the aryl group, the halogenated alkyl group, the halogenated aryl group, the alkenyl group, and the organic group having an epoxy group, an acryloyl group, a methacryloyl group, a mercapto group, or a cyano group as $R^4$, $R^5$, $R^6$, and $R^7$ and examples of the alkoxy group, the acyloxy group, and the halogen group contained in the hydrolyzable group, all of which are in the silicon-containing compounds of Formula (2) and Formula (3), include the examples described with respect to Formula (1).

Examples of the silicon-containing compound of Formula (2) include tetramethoxysilane, tetrachlorosilane, tetraacetoxysilane, tetraethoxysilane, tetra n-propoxysilane, tetraisopropoxysilane, tetra n-butoxysilane, tetraacetoxysilane, methyltrimethoxysilane, methyltrichlorosilane, methyltriacetoxysilane, methyltripropoxysilane, methyltriacetoxysilane, methyltributoxysilane, methyltripropoxysilane, methyltriamyloxysilane, methyltriphenoxysilane, methyltribenzyloxysilane, methyltriphenethyloxysilane, glycidoxymethyltrimethoxysilane, glycidoxymethyltriethoxysilane, α-glycidoxyethyltrimethoxysilane, α-glycidoxyethyltriethoxysdane, β-glycidoxyethyltrimethoxysilane, β-glycidoxyethyltriethoxysilane, α-glycidoxypropyltrimethoxysilane, α-glycidoxypropyltriethoxysilane, β-glycidoxypropyltrimethoxysilane, β-glycidoxypropyhriethoxysilane, γ-glycidoxypropyltrimethoxysilane, γ-glycidoxypropyltriethoxysilane, γ-glycidoxypropyltripropoxysilane, γ-glycidoxypropyltributoxysilane, γ-glycidoxypropyltriphenoxysilane, α-glycidoxybutyltrimethoxysilane, α-glycidoxybutyltriethoxysilane, β-glycidoxybutyltriethoxysilane, γ-glycidoxybutyltrimethoxysilane, γ-glycidoxybutyltriethoxysilane, δ-glycidoxybutyltrimethoxysilane, δ-glycidoxybutyltriethoxysilane, (3,4-epoxycyclohexyl)methyltrimethoxysilane, (3,4-epoxycyclohexyl)methyltriethoxysilane, β-(3,4-epoxycyclohexyl)ethyltrimethoxysilane, β-(3,4-epoxycyclohexyl)ethyltriethoxysilane, ethyltriethoxysilane, β-(3,4-epoxycyclohexyl)ethyltripropoxysilane, β-(3,4-epoxycyclohexyl)ethyltripropoxysilane, β-(3,4-epoxycyclohexyl)ethyltributoxysilane, γ-(3,4-epoxycyclohexyl)propyltrimethoxysilane, γ-(3,4-epoxycyclohexyl)propyltriethoxysilane, δ-(3,4-epoxycyclohexyl)butyltrimethoxysilane, δ-(3,4-epoxycyclohexyl)butyltriethoxysilane, glycidoxymethylmethyldimethoxysilane, glycidoxymethylmethyldiethoxysilane, α-glycidoxyethylmethyldimethoxysilane, α-glycidoxyethylmethyldiethoxysilane, β-glycidoxyethylmethyldimethoxysilane, β-glycidoxyethylethyldimethoxysilane, α-glycidoxypropylmethyldimethoxysilane, α-glycidoxypropylmethyldiethoxysilane, β-glycidoxypropylmethyldimethoxysilane, β-glycidoxypropylethyldimethoxysilane, γ-glycidoxypropylmethyldimethoxysilane, γ-glycidoxypropylmethyldiethoxysilane, γ-glycidoxypropylmethyldipropoxysilane, γ-glycidoxypropylmethyldibutoxysilane, γ-glycidoxypropylmethyldiphenoxysilane, γ-glycidoxypropylethyldimethoxysilane, γ-glycidoxypropylethyldiethoxysilane, γ-glycidoxypropylvinyldimethoxysilane, γ-glycidoxypropylvinyldiethoxysilane, ethyltrimethoxysilane, ethyltriethoxysilane, vinyltrimethoxysilane, vinyltrichlorosilane, vinyltriacetoxysilane, vinyltriethoxysilane, vinyltriacetoxysilane, phenyltrimethoxysilane, phenyltrichlorosilane, phenyltriacetoxysilane, phenyltriethoxysilane, phenyltriacetoxysilane, γ-chloropropyltrimethoxysilane, γ-chloropropyltriethoxysilane, γ-chloropropyltriacetoxysilane, 3,3,3-trifluoropropyltrimethoxysilane, γ-methacryloxypropyltrimethoxysilane, γ-mercaptopropyltrimethoxysilane, γ-mercaptopropyltriethoxysilane, β-cyanoethyltriethoxysilane, chloromethyltrimethoxysilane, chloromethyltriethoxysilane, dimethyldimethoxysilane, phenylmethyldimethoxysilane, dimethyldiethoxysilane, phenylmethyldiethoxysilane, γ-chloropropylmethyldimethoxysilane, γ-chloropropylmethyldiethoxysilane, dimethyldiacetoxysilane, γ-methacryloxypropylmethyldimethoxysilane, γ-methacryloxypropylmethyldiethoxysilane, γ-mercaptopropylmethyldimethoxysilane, γ-mercaptomethyldiethoxysilane, methylvinyldimethoxysilane, and methylvinyldiethoxysilane.

Examples of the silicon-containing compound of Formula (3) include methylenebistrimethoxysilane, methylenebistrichlorosilane, methylenebistriacetoxysilane, ethylenebistriethoxysilane, ethylenebistrichlorosilane, ethylenebistriacetoxysilane, propylenebistriethoxysilane, butylenebistrimethoxysilane, phenylenebistrimethoxysilane, phenylenebistriethoxysilane, phenylenebismethyldiethoxysilane, phenylenebismethyldimethoxysilane, naphthylenebistrimethoxysilane, bistrimethoxydisilane, bistriethoxydisilane, bisethyldiethoxydisilane, and bismethyldimethoxydisilane.

Specific examples of the hydrolysis-condensation product of the hydrolyzable organosilane of Formula (1) with the silicon-containing compound of Formula (3) include the following.

Formula (3-1)

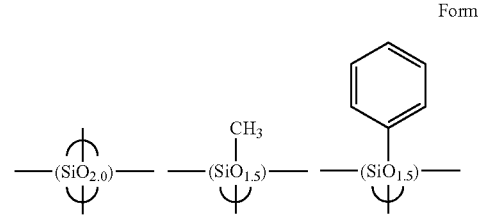

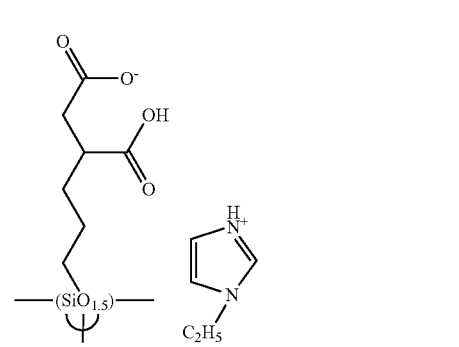

Formula (3-2)

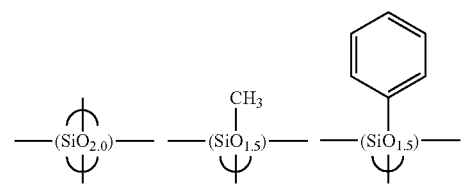

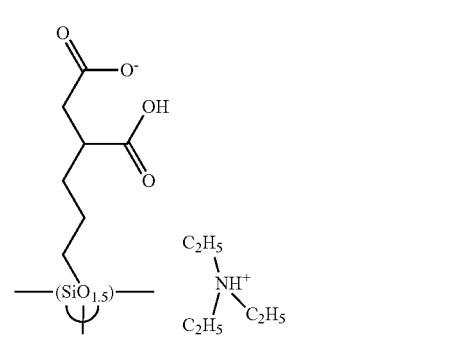

Formula (3-3)

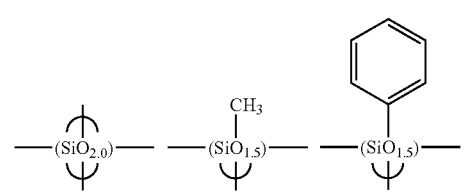

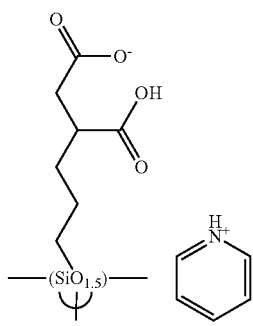

Formula (3-4)

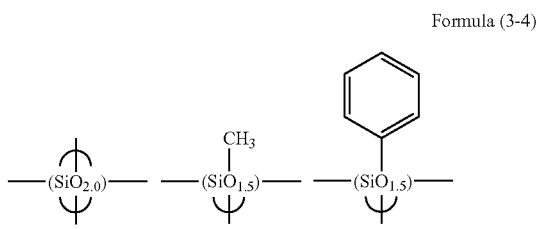

Formula (3-5)

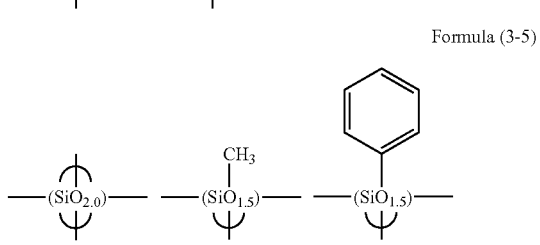

Formula (3-6)

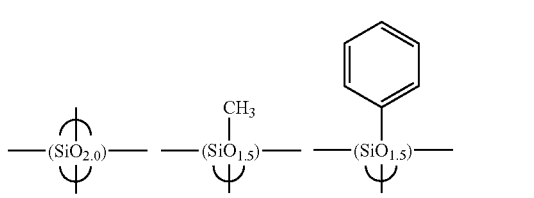

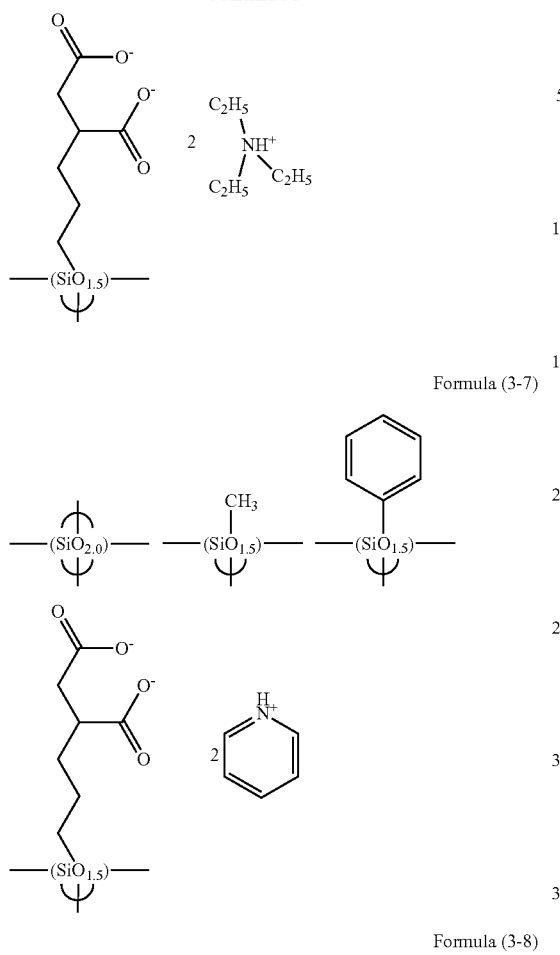
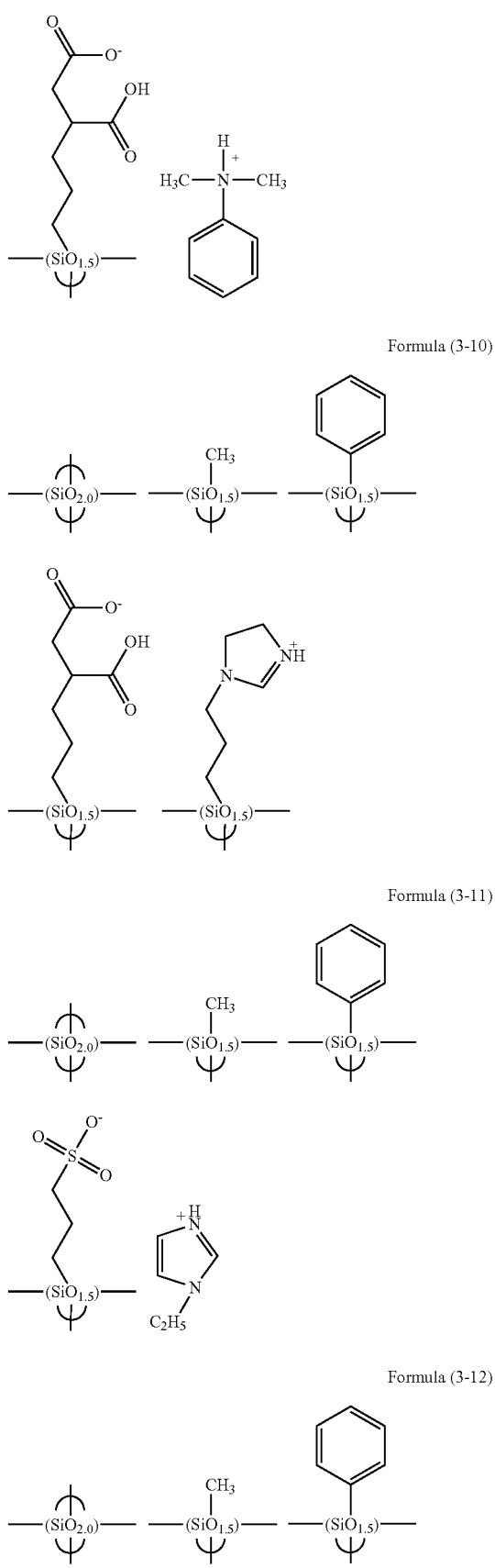

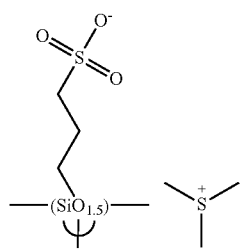
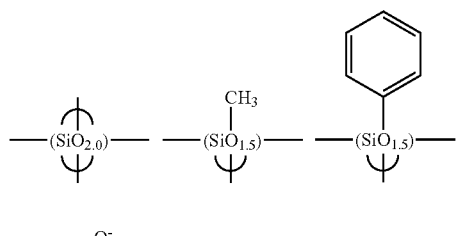
Formula (3-13)
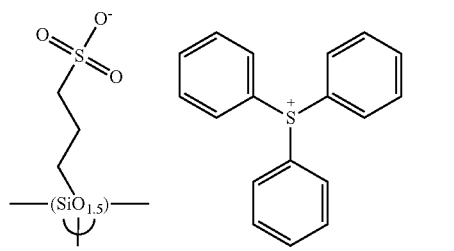
Formula (3-14)
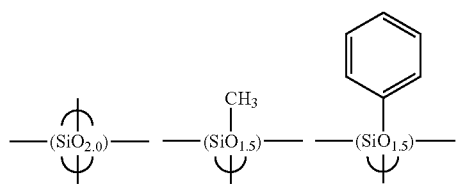
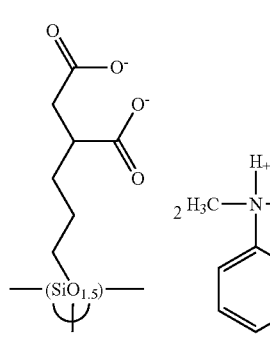
Formula (3-15)
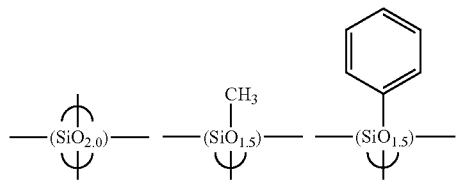
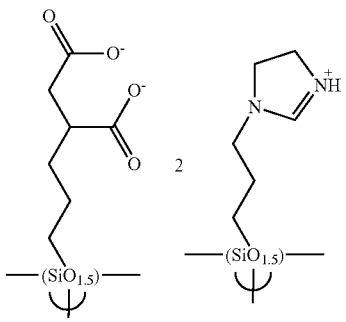
Formula (3-16)
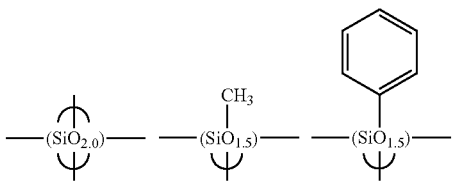
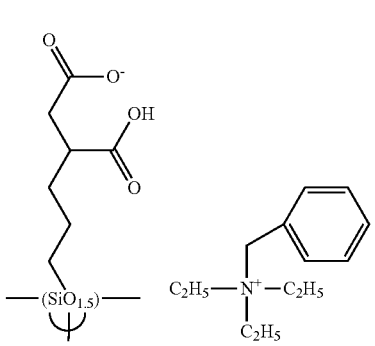
Formula (3-17)
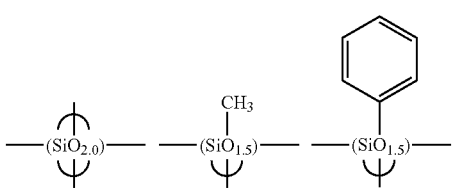
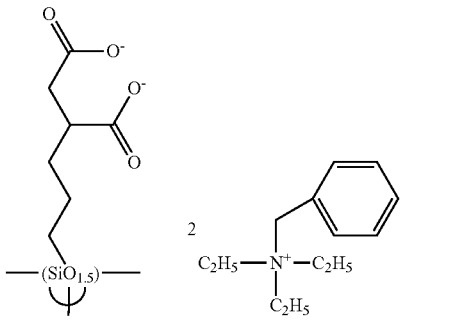
Formula (3-18)
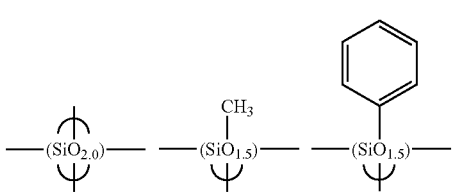

-continued
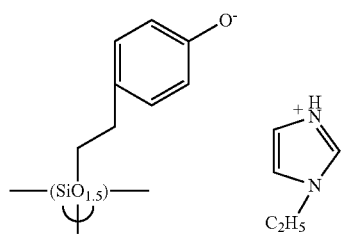
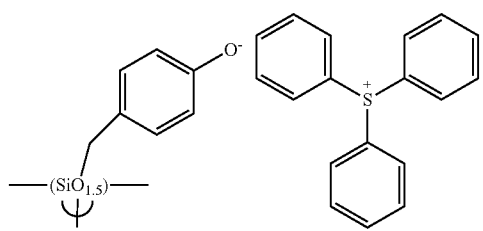
Formula (3-19)
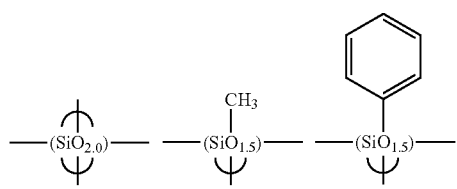
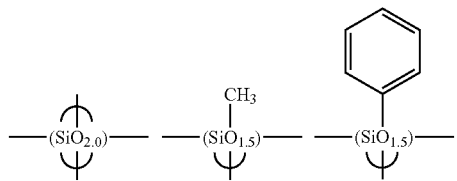
Formula (3-22)
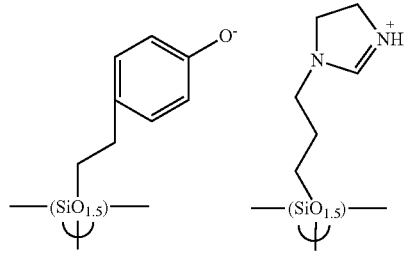
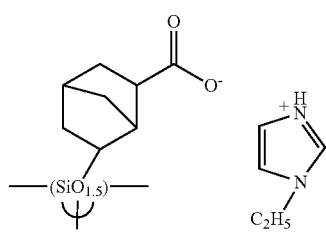
Formula (3-23)
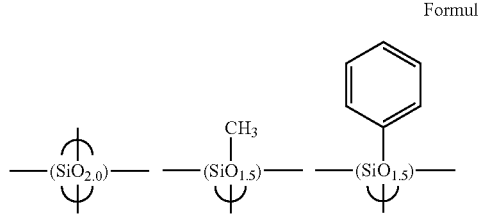
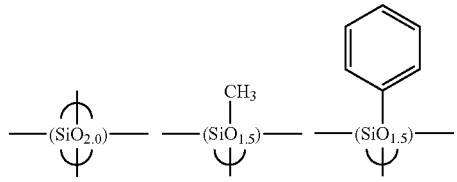
Formula (3-20)
Formula (3-24)
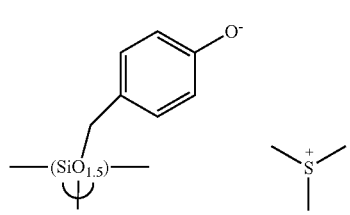
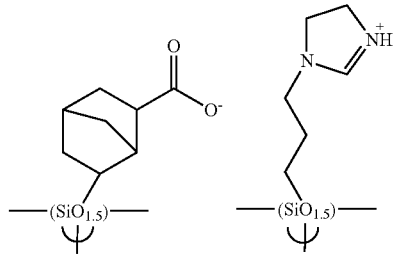
Formula (3-21)
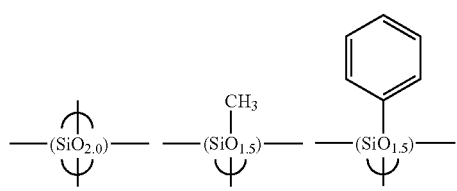
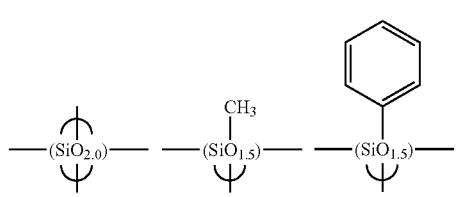

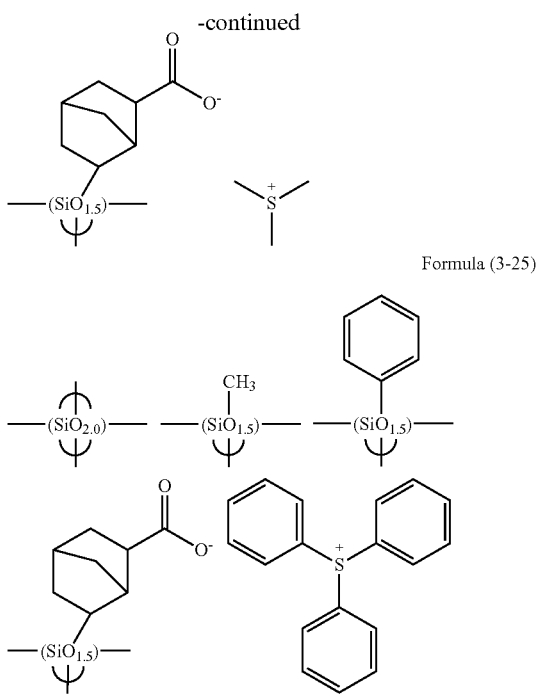

Formula (3-25)

The obtained silane compound (polymer) is a composition containing a silane compound containing an anion group and a silane compound containing no anion group, and the silane compound containing an anion group may exist in the whole silane compound in a ratio of less than 1 mol %, preferably 0.01 to 0.95 mol %.

That is, in the obtained polymer in which the organic group containing an anion group is bonded to a silicon atom and the anion group has a salt structure, the ratio of the number of repeating units of Si—O having an anion salt structure to the number of all repeating units of Si—O may be 0.01 to 1%, preferably 0.01 to 0.95%.

The anion group has actions of accelerating the hydrolysis of a hydrolyzable group of a silane, accelerating the condensation of the generated silanol group, and accelerating the formation and curing of a polyorganosiloxane.

The hydrolysis-condensation product (polyorganosiloxane) of the hydrolyzable organosilane of Formula (1) or the hydrolysis-condensation product (polyorganosiloxane) of the hydrolyzable organosilane of Formula (1) with the organic silicon compound of Formula (2) and/or Formula (3) can be obtained as a condensation product having a weight average molecular weight of 1,000 to 1,000,000 or 1,000 to 100,000. This molecular weight is a molecular weight in terms of polystyrene, measured by a GPC analysis.

Examples of the condition for the GPC measurement include: using a GPC apparatus (trade name: HLC-8220GPC; manufactured by Tosoh Corporation); using a GPC column (trade names: Shodex KF803L, KF802, and KF801; manufactured by Showa Denko K.K.); using a column temperature of 40° C.; using tetrahydrofuran as the eluting liquid (eluting solvent); using a flow amount (flow rate) of 1.0 ml/min; and using polystyrene (manufactured by Showa Denko K.K.) as the standard sample.

For the hydrolysis of an alkoxysilyl group, an acyloxysilyl group, or a halogenated silyl group, water is used in an amount of 0.5 to 100 mol, preferably 1 to 10 mol, relative to 1 mol of a hydrolyzable group.

In the present invention, the anion group existing in the molecule of a silane exhibits a catalyst action of accelerating a hydrolysis catalysis. However, further a catalyst for the hydrolysis can additionally be blended in. The catalyst for the hydrolysis can be used in an amount of 0.001 to 10 mol, preferably 0.001 to 1 mol, relative to 1 mol of a hydrolyzable group.

The reaction temperature for performing the hydrolysis and the condensation is usually 20 to 80° C.

The hydrolysis may be performed either completely or partially. That is, in the hydrolysis-condensation product, a hydrolysis product or a monomer may remain.

Examples of the catalyst for the hydrolysis include metal chelate compounds, organic acids, inorganic acids, organic bases, and inorganic bases.

Examples of the metal chelate compound as the catalyst for the hydrolysis include: titanium chelate compounds such as triethoxy.mono(acetylacetonate)titanium, tri-n-propoxy.mono(acetylacetonate)titanium, tri-isopropoxy.mono(acetylacetonate)titanium, tri-n-butoxy.mono(acetylacetonate)titanium, tri-sec-butoxy.mono(acetylacetonate)titanium, tri-tert-butoxy.mono(acetylacetonate)titanium, diethoxy.bis(acetylacetonate)titanium, di-n-propoxy.bis(acetylacetonate)titanium, di-isopropoxy.bis(acetylacetonate)titanium, di-n-butoxy.bis(acetylacetonate)titanium, di-sec-butoxy.bis(acetylacetonate)titanium, di-tert-butoxy.bis(acetylacetonate)titanium, monoethoxy.tris(acetylacetonate)titanium, mono-n-propoxy-tris(acetylacetonate)titanium, mono-isopropoxy.tris(acetylacetonate)titanium, mono-n-butoxy.tris(acetylacetonate)titanium, mono-sec-butoxy.tris(acetylacetonate)titanium, mono-tert-butoxy.tris(acetylacetonate)titanium, tetrakis(acetylacetonate)titanium, triethoxy.mono(ethylacetoacetate)titanium, tri-n-propoxy.mono(ethylacetoacetate)titanium, tri-isopropoxy.mono(ethylacetoacetate)titanium, tri-n-butoxy.mono(ethylacetoacetate)titanium, tri-sec-butoxy.mono(ethylacetoacetate)titanium, tri-tert-butoxy.mono(ethylacetoacetate)titanium, diethoxy.bis(ethylacetoacetate)titanium, di-n-propoxy.bis(ethylacetoacetate)titanium, di-isopropoxy.bis(ethylacetoacetate)titanium, di-n-butoxy.bis(ethylacetoacetate)titanium, di-sec-butoxy.bis(ethylacetoacetate)titanium, di-tert-butoxy.bis(ethylacetoacetate)titanium, monoethoxy.tris(ethylacetoacetate)titanium, mono-n-propoxy.tris(ethylacetoacetate)titanium, mono-isopropoxy.tris(ethylacetoacetate)titanium, mono-n-butoxy.tris(ethylacetoacetate)titanium, mono-sec-butoxy.tris(ethylacetoacetate)titanium, mono-tert-butoxy.tris(ethylacetoacetate)titanium, tetrakis(ethylacetoacetate anium, mono(acetylacetonate)tris(ethylacetoacetate)titanium, bis(acetylacetonate)bis(ethylacetoacetate)titanium, and tris(acetylacetonate)mono(ethylacetoacetate)titanium; zirconium chelate compounds such as triethoxy.mono(acetylacetonate)zirconium, tri-n-propoxy.mono(acetylacetonate)zirconium, tri-isopropoxy.mono(acetylacetonate)zirconium, tri-n-butoxy.mono(acetylacetonate)zirconium, tri-sec-butoxy.mono(acetylacetonate)zirconium, tri-tert-butoxy.mono(acetylacetonate)zirconium, diethoxy.bis(acetylacetonate)zirconium, di-n-propoxy.bis(acetylacetonate)zirconium, di-isopropoxy.bis(acetylacetonate)zirconium, di-n-butoxy.bis(acetylacetonate)zirconium, di-sec-butoxy.bis(acetylacetonate)zirconium, di-tert-butoxy.bis(acetylacetonate)zirconium, monoethoxy.tris(acetylacetonate)zirconium, mono-n-propoxy.tris(acetylacetonate)zirconium, mono-isopropoxy.tris(acetylacetonate)zirconium, mono-n-butoxy.tris(acetylacetonate)zirconium, mono-sec-butoxy.tris(acetylacetonate)zirconium, mono-tert-butoxy.tris(acetylacetonate)zirconium, tetrakis(acetylacetonate)zirconium, triethoxy.mono(ethylacetoacetate)zirconium, trin-propoxy.mono(ethylacetoacetate)zirconium, tri-isopropoxy.mono(ethylacetoacetate)zirconium, tri-n-butoxy.mono(ethylacetoacetate)zirconium, tri-sec-butoxy.mono(ethylacetoacetate)zirconium, tri-tert-butoxy.mono(ethylacetoacetate)zirconium, diethoxy.bis(ethylacetoacetate)zirconium, di-n-propoxy.bis(ethylacetoacetate)zirconium, di-isopropoxy.bis(ethylacetoacetate)zirconium, di-n-butoxy.bis(ethylacetoacetate)zirconium, di-sec-butoxy.bis(ethylacetoacetate)zirconium, di-tert-butoxy.bis(ethylacetoacetate)zirconium, monoethoxy.tris(ethylacetoacetate)zirconium, mono-n-propoxy.tris(ethylacetoacetate)zirconium, mono-isopropoxy.tris(ethylacetoacetate)zirconium, mono-n-butoxy-tris(ethylacetoacetate)zirconium, mono-sec-butoxy.tris(ethylacetoacetate)zirconium, mono-tert-butoxy.tris(ethylacetoacetate)zirconium, tetrakis(ethylacetoacetate)zirconium, mono(acetylacetonate)tris(ethylacetoacetate)zirconium, bis(acetylacetonate)bis(ethylacetoacetate)zirconium, and tris(acetylacetonate)mono(ethylacetoacetate)zirconium; and aluminum chelate compounds such as tris(acetylacetonate)aluminum and tris(ethylacetoacetate)aluminum Examples of the organic acid as the catalyst for the hydrolysis include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linolic acid, linoleic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid.

Examples of the inorganic acid as the catalyst for the hydrolysis include hydrochloric acid, nitric acid, sulfuric acid, hydrofluoric acid, and phosphoric acid.

Examples of the organic base as the catalyst for the hydrolysis include pyridine, pyrrole, piperazine, pyrrolidine, piperidine, picoline, trimethylamine, triethylamine, monoethanolamine, diethanolamine, dimethylmonoethanolamine, monomethyldiethanolamine, triethanolamine, diazabicyclo octane, diazabicyclo nonane, diazabicyclo undecene, and tetramethylammonium hydroxide. Examples of the inorganic base include ammonia, sodium hydroxide, potassium hydroxide, barium hydroxide, and calcium hydroxide. Among these catalysts, metal chelate compounds, organic acids, and inorganic acids are preferred and these catalysts may be used singly or in combination of two or more types thereof.

Examples of the organic solvent used for the hydrolysis include: aliphatic hydrocarbon solvents such as n-pentane, isopentane, n-hexane, isohexane, n-heptane, isoheptane, 2,2,4-trimethylpentane, n-octane, isooctane, cyclohexane, and methylcyclohexane; aromatic hydrocarbon solvents such as benzene, toluene, xylene, ethylbenzene, trimethylbenzene, methylethylbenzene, n-propylbenzene, isopropylbenzene, diethylbenzene, isobutylbenzene, triethylbenzene, di-isopropylbenzene, n-amylnaphthalene, and trimethylbenzene; monoalcohol solvents such as methanol, ethanol, n-propanol, isopropanol, n-butanol, isobutanol, sec-butanol, tert-butanol, n-pentanol, isopentanol, 2-methylbutanol, sec-pentanol, tert-pentanol, 3-methoxybutanol, n-hexanol, 2-methylpentanol, sec-hexanol, 2-ethylbutanol, sec-heptanol, heptanol-3, n-octanol, 2-ethylhexanol, sec-octanol, n-nonyl alcohol, 2,6-dimethylheptanol-4, n-decanol, sec-undecyl alcohol, trimethylnonyl alcohol, sec-tetradecyl alcohol, sec-heptadecyl alcohol, phenol, cyclohexanol, methylcyclohexanol, 3,3,5-trimethylcyclohexanol, benzyl alcohol, phenylmethylcarbinol, diacetone alcohol, and cresol; polyalcohol solvents such as ethylene glycol, propylene glycol, 1,3-butylene glycol, pentanediol-2,4,2-methylpentanediol-2,4, hexanediol-2,5, heptanediol-2,4,2-ethylhexanediol-1,3, diethylene glycol, dipropylene glycol, triethylene glycol, tripropylene glycol, and glycerin; ketone solvents such as acetone, methyl ethyl ketone, methyl-n-propyl ketone, methyl-n-butyl ketone, diethyl ketone, methyl-isobutyl ketone, methyl-n-pentyl ketone, ethyl-n-butyl ketone, methyl-n-hexyl ketone, di-isobutyl ketone, trimethylnonanone, cyclohexanone, methylcyclohexanone, 2,4-pentanedione, acetonylacetone, diacetone alcohol, acetophenone, and fenchone; ether solvents such as ethyl ether, isopropyl ether, n-butyl ether, n-hexyl ether, 2-ethylhexyl ether, ethylene oxide, 1,2-propylene oxide, dioxolane, 4-methyldioxolane, dioxane, dimethyldioxane, ethylene glycol monomethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethylbutyl ether, ethylene glycol dibutyl ether, diethylene glycol monomethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, dipropylene glycol monopropyl ether, dipropylene glycol monobutyl ether, tripropylene glycol monomethyl ether, tetrahydrofuran, and 2-methyltetrahydrofuran; ester solvents such as diethyl carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethyleneglycol monomethyl ether acetate, ethyleneglycol monoethyl ether acetate, diethyleneglycol monomethyl ether acetate, diethyleneglycol monoethyl ether acetate, diethyleneglycol mono-n-butyl ether acetate, propyleneglycol monomethyl ether acetate, propyleneglycol monoethyl ether acetate, propyleneglycol monopropyl ether acetate, propyleneglycol monobutyl ether acetate, dipropyleneglycol monomethyl ether acetate, dipropyleneglycol monoethyl ether acetate, glycol diacetate, methoxytriglycol acetate, ethyl propionate, n-butyl propionate, isoamyl propionate, diethyl oxalate, di-n-butyl oxalate, methyl lactate, ethyl lactate, n-butyl lactate, n-amyl lactate, diethyl malonate, dimethyl phthalate, and diethyl phthalate; nitrogen-containing solvents such as N-methylformamide, N,N-dimethylformamide, N,N-diethylformamide, acetamide, N-methylacetamide, N,N-dimethylacetamide, N-methylpropionamide, and N-methylpyrrolidone; and sulfur-containing solvents such as dimethyl sulfide, diethyl sulfide, thiophene, tetrahydrothiophene, dimethylsulfoxide, sulfolane, and 1,3-propane sultone. These solvents may be used singly or in combination of two or more types thereof.

Particularly, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol monomethyl ether acetate, propylene glycol monoethyl ether acetate, propylene glycol monopropyl ether acetate, and 4-methyl-2-pentanol are preferred in terms of the preservation stability of the solution thereof.

From the hydrolysis-condensation product (polymer) obtained by hydrolyzing and condensing a hydrolyzable organosilane in a solvent using a catalyst, an alcohol as a by-product and the used hydrolyzing catalyst and water can simultaneously be removed by distilling them under reduced pressure or the like. The acid or the base catalyst used for the hydrolysis can be removed by neutralization or ion-exchange. Then, in the resist underlayer film forming composition for lithography of the present invention containing the hydrolysis-condensation product thereof, an organic acid, water, an alcohol, or a combination thereof can be blended for the stabilization of the composition.

Examples of the organic acid include oxalic acid, malonic acid, methylmalonic acid, succinic acid, maleic acid, malic acid, tartaric acid, phthalic acid, citric acid, glutaric acid, citric acid, lactic acid, and salicylic acid. Among them, oxalic acid and maleic acid are preferred. The amount of the organic acid to be blended in is 0.1 to 5.0 parts by mass, relative to 100 parts by mass of the condensation product (polyorganosiloxane). As the water to be blended in, pure water, ultrapure water, ion-exchanged water, or the like can be used and the blended amount thereof can be 1 to 20 part(s) by mass, relative to 100 parts by mass of the resist underlayer film forming composition.

As the alcohol to be blended in, an alcohol that is easily vaporized by heating after the application is preferred and examples thereof include methanol, ethanol, propanol, isopropanol, butanol, and 4-methyl-2-pentanol. The amount of the alcohol to be blended in can be 1 to 20 part(s) by mass, relative to 100 parts by mass of the resist underlayer film forming composition.

The underlayer film forming composition for lithography of the present invention may contain, if necessary, organic polymer compounds, photoacid generators, surfactants, and the like, besides the above components.

By using an organic polymer compound, there can be controlled the dry etching rate (a decreased amount of the film thickness per unit time), the attenuation coefficient, the refractive index, and the like of a resist underlayer film formed from the underlayer forming composition for lithography of the present invention.

The organic polymer compound is not particularly limited and various organic polymers such as condensation-polymerized polymers and addition-polymerized polymers can be used. As the organic polymer compound, there can be used addition-polymerized polymers and condensation-polymerized polymers such as polyesters, polystyrenes, polyimides, acrylic polymers, methacrylic polymers, polyvinylethers, phenolnovolacs, naphtholnovolacs, polyethers, polyamides, and polycarbonates. There are preferably used an organic polymer having an aromatic ring structure functioning as a light absorbing moiety such as a benzene ring, a naphthalene ring, an anthracene ring, a triazine-trione ring, a quinoline ring, and a quinoxaline ring.

Examples of such an organic polymer compound include addition-polymerized polymers containing, as a structure unit thereof, an addition-polymerizable monomer such as benzylacrylate, benzylmethacrylate, phenylacrylate, naphthylacrylate, anthrylacrylate, anthrylmethylmethacrylate, styrene, hydroxystyrene, benzylvinyl ether, and N-phenylmaleimide, and condensation-polymerized polymers such as phenolnovolacs and naphtholnovolacs.

When an addition-polymerized polymer is used as the organic polymer compound, the polymer compound may be either a homopolymer or a copolymer. For producing the addition-polymerized polymer, an addition-polymerizable monomer is used. Examples of such an addition-polymerizable monomer include acrylic acid, methacrylic acid, acrylic acid ester compounds, methacrylic acid ester compounds, acrylamide compounds, methacrylamide compounds, vinyl compounds, styrene compounds, maleimide compounds, maleic anhydride, and acrylonitrile.

Examples of the acrylic acid ester compound include methyl acrylate, ethyl acrylate, normal hexyl acrylate, isopropyl acrylate, cyclohexyl acrylate, benzyl acrylate, phenyl acrylate, anthrylmethyl acrylate, 2-hydroxyethyl acrylate, 3-chloro-2-hydroxypropyl acrylate, 2-hydroxypropyl acrylate, 2,2,2-trifluoroethyl acrylate, 2,2,2-trichloroethyl acrylate, 2-bromoethyl acrylate, 4-hydroxybutyl acrylate, 2-methoxyethyl acrylate, tetrahydrofurfuryl acrylate, 2-methyl-2-adamantyl acrylate, 5-acryloyloxy-6-hydroxynorbornene-2-carboxylic-6-lactone, 3-acryloxypropyltriethoxysilane, and glycidyl acrylate.

Examples of the methacrylic acid ester compound include methyl methacrylate, ethyl methacrylate, normal hexyl methacrylate, isopropyl methacrylate, cyclohexyl methacrylate, benzyl methacrylate, phenyl methacrylate, anthrylmethyl methacrylate, 2-hydroxyethyl methacrylate, 2-hydroxypropyl methacrylate, 2,2,2-trifluoroethyl methacrylate, 2,2,2-trichloroethyl methacrylate, 2-bromoethyl methacrylate, 4-hydroxybutyl methacrylate, 2-methoxyethyl methacrylate, tetrahydrofurfuryl methacrylate, 2-methyl-2-adamantyl methacrylate, 5-methacryloyloxy-6-hydroxynorbornene-2-carboxylic-6-lactone, 3-methacryloxypropyltriethoxysilane, glycidyl methacrylate, 2-phenylethyl methacrylate, hydroxyphenyl methacrylate, and bromophenyl methacrylate.

Examples of the acrylamide compound include acrylamide, N-methylacrylamide, N-ethylacrylamide, N-benzylacrylamide, N-phenylacrylamide, N,N-dimethylacrylamide, and N-anthrylacrylamide.

Examples of the methacrylamide compound include methacrylamide, N-methylmethacrylamide, N-ethylmethacrylamide, N-benzylmethacrylamide, N-phenylmethacrylamide, N,N-dimethylmethacrylamide, and N-anthrylacrylamide.

Examples of the vinyl compound include vinyl alcohol, 2-hydroxyethyl vinyl ether, methyl vinyl ether, ethyl vinyl ether, benzyl vinyl ether, vinylacetic acid, vinyltrimethoxysilane, 2-chloroethyl vinyl ether, 2-methoxyethyl vinyl ether, vinylnaphthalene, and vinylanthracene.

Examples of the styrene compound include styrene, hydroxystyrene, chlorostyrene, bromostyrene, methoxystyrene, cyanostyrene, and acetylstyrene.

Examples of the maleimide compound include maleimide. N-methylmaleimide, N-phenylmaleimide. N-cyclohexylmaleimide. N-benzylmaleimide, and N-hydroxyethylmaleimide.

When a condensation-polymerized polymer is used as the polymer, examples of such a polymer include condensation-polymerized polymers of a glycol compound and a dicarboxylic acid compound. Examples of the glycol compound include diethylene glycol, hexamethylene glycol, and butylene glycol. Examples of the dicarboxylic acid compound include succinic acid, adipic acid, terephthalic acid, and maleic anhydride. Examples of the polymer also include polyesters, polyamides, and polyimides such as polypyromellitimide, poly(p-phenyleneterephthalamide), polybutyleneterephthalate, and polyethyleneterephthalate.

When the organic polymer compound contains a hydroxy group, the hydroxy group can effect a crosslinking reaction with a polyorganosiloxane. As the organic polymer compound, there can be used a polymer compound having a weight average molecular weight of, for example, 1,000 to 1,000,000, or 3,000 to 300,000, or 5,000 to 200,000, or 10,000 to 100,000.

The organic polymer compounds may be used singly or in combination of two or more types thereof.

When the organic polymer compound is used, the ratio thereof is 1 to 200 part(s) by mass, or 5 to 100 parts by mass, or 10 to 50 parts by mass, or 20 to 30 parts by mass, relative to 100 parts by mass of the condensation product (polyorganosiloxane).

The resist underlayer film forming composition of the present invention may contain an acid generator.

Examples of the acid generator include thermoacid generators and photoacid generators.

The photoacid generator generates an acid during exposure of the resist. Therefore, the acidity of the underlayer film can be controlled. This is one method for adjusting the acidity of the underlayer film to that of the resist as an upper layer of the underlayer film. By adjusting the acidity of the underlayer film, the pattern shape of the resist formed in the upper layer can be controlled.

Examples of the photoacid generator contained in the resist underlayer film forming composition of the present invention include onium salt compounds, sulfonimide compounds, and disulfonyl diazomethane compounds.

Examples of the onium salt compound include: iodonium salt compounds such as diphenyliodoniumhexafluorophosphate, diphenyliodoniumtrifluoromethanesulfonate, diphenyliodoniumnonafluoro normal butane sulfonate, diphenyliodoniumperfluoro normal octane sulfonate, diphenyliodoniumcamphorsulfonate, bis(4-tert-butylphenyl)iodoniumcamphorsulfonate, and bis(4-tert-butylphenyl)iodoniumtrifluoromethanesulfonate; and sulfonium salt compounds such as triphenylsulfoniumhexafluoroantimonate, triphenylsulfoniumnonafluoro normal butane sulfonate, triphenylsulfoniumcamphorsulfonate, and triphenylsulfoniumtrifluoromethanesulfonate.

Examples of the sulfonimide compound include N-(trifluoromethanesulfonyloxy)succinimide, N-(nonafluoro normal butane sulfonyloxy)succinimide, N-(camphorsulfonyloxy)succinimide, and N-(trifluoromethanesulfonyloxy)naphthalimide.

Examples of the disulfonyldiazomethane compound include bis(trifluoromethylsulfonyl)diazomethane, bis(cyclohexylsulfonyl)diazomethane, bis(phenylsulfonyl)diazomethane, bis(p-toluenesulfonyl)diazomethane, bis(2,4-dimethylbenzenesulfonyl)diazomethane, and methylsulfonyl-p-toluenesulfonyldiazomethane.

These photoacid generators may be used singly or in combination of two or more types thereof.

When the photoacid generator is used, the ratio thereof is 0.01 to 5 parts by mass, or 0.1 to 3 parts by mass, or 0.5 to 1 part(s) by mass, relative to 100 parts by mass of the condensation product (polyorganosiloxane).

The surfactant is effective for suppressing the formation of a pinhole, a striation, and the like when the resist underlayer film forming composition for lithography of the present invention is applied on a substrate.

Examples of the surfactant contained in the resist underlayer film forming composition of the present invention include: nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylallyl ethers such as polyoxyethylene octylphenol ether and polyoxyethylene nonylphenol ether, polyoxyethylene.polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorinated surfactants, for example, EFTOP EF301, EF303, and EF352 (trade name; manufactured by Tohkem Products Corp.), MEGAFAC F171, F173, R-08, and R-30 (trade name; manufactured by Dainippon Ink and Chemicals, Inc.), Fluorad FC430 and FC431 (manufactured by Sumitomo 3M Limited), AsahiGuard AG710 and Surflon S-382, SC101, SC102, SC103, SC104, SC105, and SC106 (trade name; manufactured by Asahi Glass Co., Ltd.); and Organosiloxane polymer KP341 (manufactured by Shin-Etsu Chemical Co., Ltd.). These surfactants may be used singly or in combination of two or more types thereof. When the surfactant is used, the ratio thereof is 0.0001 to 5 parts by mass, or 0.001 to 1 part(s) by mass, or 0.01 to 0.5 parts by mass, relative to 100 parts by mass of the condensation product (polyorganosiloxane).

In the resist underlayer film forming composition of the present invention, a rheology controlling agent and an adhesion assistant may be blended. The rheology controlling agent is effective for enhancing the fluidity of the underlayer film forming composition. The adhesion assistant is effective for enhancing the adhesion of the underlayer film to the semiconductor substrate or the resist.

The solvent used for the resist underlayer film forming composition of the present invention is not particularly limited so long as the solvent can dissolve the above solid content. Examples of such a solvent include methyl cellosolve acetate, ethyl cellosolve acetate, propylene glycol, propylene glycol monomethyl ether, propylene glycol monobutyl ether, propylene glycol monomethyl ether acetate, propylene glycol monoethyl ether acetate, propylene glycol monopropyl ether acetate, propylene glycol monobutyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl) ether, diethylene glycol dibutyl ether, propylene glycol monomethyl ether, propylene glycol dimethyl ether, propylene glycol diethyl ether, propylene glycol dipropyl ether, propylene glycol dibutyl ether, ethyl lactate, propyl lactate, isopropyl lactate, butyl lactate, isobutyl lactate, methyl formate, ethyl formate, propyl formate, isopropyl formate, butyl formate, isobutyl formate, amyl formate, isoamyl formate, methyl acetate, ethyl acetate, amyl acetate, isoamyl acetate, hexyl acetate, methyl propionate, ethyl propionate, propyl propionate, isopropyl propionate, butyl propionate, isobutyl propionate, methyl butyrate, ethyl butyrate, propyl butyrate, isopropyl butyrate, butyl butyrate, isobutyl butyrate, ethyl hydroxyacetate, ethyl 2-hydroxy-2-methylpropionate, methyl 3-methoxy-2-methylpropionate, ethyl 2-hydroxy-3-methylbutyrate, ethyl methoxyacetate, ethyl ethoxyacetate, methyl 3-methoxypropionate, ethyl 3-ethoxypropionate, ethyl 3-methoxypropionate, 3-methoxybutyl acetate, 3-methoxypropyl acetate, 3-methyl-3-methoxybutyl acetate, 3-methyl-3-methoxybutyl propionate, 3-methyl-3-methoxybutyl butyrate, methyl acetoacetate, toluene, xylene, methyl ethyl ketone, methyl propyl ketone, methyl but ketone, 2-heptanone, 3-heptanone, 4-heptanone, cyclohexanone, N,N-dimethylformamide, N-methylacetamide, N,N-dimethylacetamide, N-methylpyrrolidone, γ-butyrolactone, and 4-methyl-2-pentanol. These solvents may be used singly or in combination of two or more types thereof.

In the present invention, the resist underlayer film is formed by an applying method either on a substrate or on an organic underlayer film on a substrate, and on the resist underlayer film, a resist film (for example, a photoresist or an electron beam resist) is formed. Then, a resist pattern is formed by exposure and development, and either by dry etching the resist underlayer film using the resist pattern to transfer the pattern, the substrate is processed by the transferred pattern, or by etching the organic underlayer film to transfer the pattern, the substrate is processed by the etched organic underlayer film.

In forming a fine pattern, for preventing a pattern collapse, the resist film thickness tends to become smaller. Due to the thinning of the resist film, the dry etching for transferring the pattern to a film existing as an underlayer of the resist cannot transfer the pattern unless the etching rate of the underlayer film is higher than that of the upper layer film. In the present invention, the substrate is coated with the resist underlayer film (containing an inorganic silicon-based compound) of the present invention either with or without an organic underlayer film interposed therebetween and then the resist underlayer film is coated with a resist film (an organic resist film). An organic component film and an inorganic component film have dry etching rates largely different from each other depending on the selection of the etching gas such that the dry etching rate of the organic component film is enhanced by an oxygen-based gas and the dry etching rate of the inorganic component film is enhanced by a halogen-containing gas.

For example, there is formed a resist pattern that is transferred to the resist underlayer film of the present invention existing as the underlayer of the resist pattern by dry etching the resist underlayer film with a halogen-containing gas, and the substrate is processed with a halogen-containing gas according to the pattern transferred to the resist underlayer film. Alternatively, by dry etching the organic underlayer film existing as the underlayer of the resist underlayer film to which the pattern is transferred with an oxygen-based gas using the resist underlayer film, the pattern is transferred to the organic underlayer film, and the substrate is processed with a halogen-containing gas using the organic underlayer film to which the pattern is transferred.

Then, the polyorganosiloxane structure is effective as a hardmask for etching the organic underlayer film existing as an underlayer of the resist underlayer film or for processing (etching) the substrate. In other words, the polyorganosiloxane structure has a satisfactory dry etching resistance during the processing of the substrate or relative to an oxygen-based dry etching gas for the organic underlayer film.

The resist underlayer film of the present invention is provided with the enhancement of the dry etching rate relative to the upper layer resist and the dry etching resistance during the processing of the substrate and the like.

With a resist underlayer film material, due to a mass transfer from the resist underlayer film to the resist, an impairment of the resist shape is observed. In the present invention, it has been found that by introducing into the polymer, an anion skeleton (organic salt) such as a carboxylic acid skeleton, a phenolate skeleton, and a sulfonic acid skeleton of a salt capable of being mass-transferred, the mass transfer into the resist can be prevented and an advantageous resist shape can be obtained. By introducing an organic salt skeleton into the polymer structure, even without adding a curing catalyst, high curability can be exhibited and an advantageous resist pattern can be obtained.

Hereinafter, the use of the resist underlayer film forming composition of the present invention is described in detail.

The resist underlayer film forming composition of the present invention is applied on a substrate used in the production of semiconductor devices (for example, silicon wafer substrates, silicon/silicon dioxide coated substrates, silicon nitride substrates, glass substrates, ITO substrates, polyimide substrates, low dielectric constant material (low-k material)-coated substrates, etc.) by an appropriate coating method using a spinner, a water or the like, and then, is baked to form a resist underlayer film. The baking conditions are accordingly selected from baking temperatures of 80° C. to 250° C. and baking times of 0.3 to 60 minutes. Preferably, the baking temperature is 150° C. to 250° C. and the baking time is 0.5 to 2 minutes. Here, the formed underlayer film has a film thickness of, for example, 10 to 1,000 nm, or 20 to 500 nm, or 50 to 300 nm, or 100 to 200 nm.

Next, on the resist underlayer film, for example a photoresist layer is formed. The formation of the photoresist layer can be performed by a known method, that is, by applying a photoresist composition solution on the underlayer film and by baking the composition solution. The photoresist has a film thickness of, for example, 50 to 10,000 nm, or 100 to 2,000 nm, or 200 to 1,000 nm.

The photoresist formed on the resist underlayer film of the present invention is not particularly limited so long as the photoresist is sensitive to light used for the exposure, and both of a negative-type photoresist and a positive-type photoresist can be used. Examples of the photoresist include: a positive-type photoresist made of a novolac resin and 1,2-naphthoquirionediazide sulfonic acid ester; a chemical amplification-type photoresist made of a binder having a group elevating the alkali dissolving rate by being decomposed by an acid, and a photoacid generator; a chemical amplification-type photoresist made of a low molecule compound elevating the alkali dissolving rate of a photoresist by being decomposed by an acid, an alkali-soluble binder, and a photoacid generator; and a chemical amplification-type photoresist made of a binder having a group elevating the alkali dissolving rate by being decomposed by an acid, a low molecule compound elevating the alkali dissolving rate of a photoresist by being decomposed by an acid, and a photoacid generator. Examples of the photoresist include trade name: APEX-E manufactured by Shipley Company, L.L.C., trade name: PAR710 manufactured by Sumitomo Chemical Co., Ltd., and trade name: SEPR430 manufactured by Shin-Etsu Chemical Co., Ltd. The examples also include fluorine atom-containing polymer-based photoresists described in Proc. SPIE, Vol. 3999, 330-334 (2000), Proc. SPIE, Vol. 3999, 357-364 (2000), and Proc. SPIE, Vol. 3999, 365-374 (2000).

Next, the exposure is performed through a predetermined mask. For the exposure, a KrF excimer laser (wavelength: 248 mu), an ArF excimer laser (wavelength: 193 nm), a F2 excimer laser (wavelength: 157 nm), and the like can be used. After the exposure, if necessary post exposure bake can also be performed. The post exposure bake is performed under conditions accordingly selected from baking temperatures of 70° C. to 150° C. and baking times of 0.3 to 10 minutes.

In the present invention, as the resist, a resist for electron beam lithography can be used instead of the photoresist. As the electron beam resist, both a positive type and a negative type can be used. Examples of the electron beam resist include: a chemical amplification-type resist made of a binder having a group changing the alkali dissolving rate by being decomposed by an acid generator and an acid; a chemical amplification-type resist made of an alkali-soluble binder and a low molecule compound changing the alkali dissolving rate of a resist by being decomposed by an acid generator and an acid; a chemical amplification-type resist made of a binder having a group changing the alkali dissolving rate by being decomposed by an acid generator and an acid, and a low molecule compound changing the alkali dissolving rate of a resist by being decomposed by an acid; a non-chemical amplification-type resist made of a binder having a group changing the alkali dissolving rate by being decomposed by an electron beam; and a non-chemical amplification-type resist made of a binder having a moiety changing the alkali dissolving rate by being broken by an electron beam. Also in the case of using the electron beam resist, a resist pattern can be formed in the same manner as in the case of using a photoresist, by using an electron beam as the radiating source.

Next, development is performed by a developer. Consequently, for example when a positive-type photoresist is used, the photoresist of an exposed part is removed to form a photoresist pattern.

Examples of the developer include alkaline aqueous solutions such as: aqueous solutions of alkali metal hydroxides such as potassium hydroxide and sodium hydroxide; aqueous solutions of quaternary ammonium hydroxides such as tetramethylammonium hydroxide, tetraethylammonium hydroxide, and choline; and aqueous solutions of amines such as ethanolamine, propylamine, and ethylenediamine. Further, in these developers, a surfactant and the like may also be blended. The conditions for the development are accordingly selected from temperatures of 5 to 50° C. and times of 10 to 600 seconds.

Then, using the thus formed pattern of the photoresist (upper layer) as a protecting film, the removal of the resist underlayer film (intermediate layer) of the present invention is performed and, next, using the film composed of the patterned photoresist and the patterned resist underlayer film (intermediate layer) of the present invention as a protecting film, the removal of the organic underlayer film (underlayer) is performed. Finally, using the patterned resist underlayer film (intermediate layer) of the present invention and the patterned organic underlayer film (underlayer) as a protecting film, the processing of the semiconductor substrate is performed.

First, the resist underlayer film (intermediate layer) of the present invention at the part where the photoresist is removed is removed by dry etching to expose the semiconductor substrate. For dry etching the resist underlayer film of the present invention, there can be used gases such as tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, chlorine, and trichloroborane and dichloroborane. For dry etching the resist underlayer film, a halogen-based gas is preferably used. By dry etching with a halogen-based gas, a photoresist composed of organic substances is fundamentally difficult to be removed. On the contrary, the resist underlayer film of the present invention containing a large amount of silicon atoms is immediately removed by a halogen-based gas. Therefore, the decrease of the film thickness of the photoresist according to dry etching of the resist underlayer film can be suppressed. As a result, the photoresist can be used as a thin film. The resist underlayer film is dry-etched preferably with a fluorine-based gas and examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

Subsequently, using the film composed of the patterned photoresist and the patterned resist underlayer film of the present invention as a protecting film, the removal of the organic underlayer film is performed. The removal of the organic underlayer film (underlayer) is performed by dry etching preferably with an oxygen-based gas. This is because the resist underlayer film of the present invention containing a large amount of silicon atoms is difficult to be removed by dry etching with an oxygen-based gas.

Finally, the processing of the semiconductor substrate is performed. The processing of the semiconductor substrate is performed by dry etching preferably with a fluorine-based gas.

Examples of the fluorine-based gas include tetrafluoromethane ($CF_4$), perfluorocyclobutane ($C_4F_8$), perfluoropropane ($C_3F_8$), trifluoromethane, and difluoromethane ($CH_2F_2$).

As an upper layer of the resist underlayer film of the present invention, an organic anti-reflective coating can be formed before the formation of the photoresist. The anti-reflective coating composition used here is not particularly limited and can optionally be selected from the compositions commonly used in a conventional lithography process to be used. In addition, the formation of the anti-reflective coating can be performed by a commonly used method, for example, by applying a anti-reflective coating composition by a spinner or a coater and by baking the composition.

In the present invention, after forming the organic underlayer film on the substrate, the resist underlayer film of the present invention can be formed on the organic underlayer film, and, further, the resist underlayer film can be coated with the photoresist. Thus, even when the pattern width of the photoresist becomes smaller and the photoresist is coated thinly for preventing a pattern collapse, the processing of the substrate becomes possible by selecting an appropriate etching gas. For example, the resist underlayer film of the present invention can be processed by using a fluorine-based gas having an etching rate of the resist underlayer film satisfactorily higher than that of the photoresist as an etching gas, and the organic underlayer film can be processed by using an oxygen-based gas having an etching rate of the organic underlayer film satisfactorily higher than that of the resist underlayer film of the present invention as an etching gas. Further, the substrate can be processed by using a fluorine-based gas having an etching rate of the substrate satisfactorily higher than that of the organic underlayer film as an etching gas.

The substrate on which the resist underlayer film forming composition of the present invention is applied to may also be a substrate having an organic or inorganic anti-reflective coating formed by a CVD method and the like on its surface and, on the anti-reflective coating, the underlayer film of the present invention can also be formed.

A resist underlayer film formed from the resist underlayer film forming composition of the present invention may absorb light used in a lithography process depending on the wavelength of the light. In such a case, the resist underlayer film can function as an anti-reflective coating having the effect of preventing a reflection light on the substrate. Further, the underlayer film of the present invention can also be used as a layer for preventing an interact on between the substrate and the photoresist, a layer having a function of preventing an adverse action of a material used in the photoresist or of a substance generated during exposure of the photoresist against the substrate, a layer having a function of preventing the diffusion of a substance generated in or on the substrate during heating and baking to the upper layer photoresist, a barrier layer for reducing a poisoning effect to the photoresist layer by a semiconductor substrate dielectric layer, and the like.

A resist underlayer film formed from the resist underlayer film forming composition can be applied to a substrate in which a via hole used in the dual damascene process is formed to be used as an embedding material capable of filling the hole without a void. The resist underlayer film can also be used as a planarizing material for planarizing the surface of a semiconductor substrate having unevenness.

Hereinafter, the present invention will be more specifically described referring to Examples that should not be construed as limiting the scope of the present invention.

EXAMPLES

Synthesis Example 1

4.98 g of phenyltrimethoxysilane, 67.98 g of tetraethoxysilane, 26.89 g of methyltriethoxysilane, 0.15 g of trimethoxysilylpropyl succinic anhydride, and 150 acetone were charged into a 500 mL flask to be dissolved and the resultant mixed solution was warmed while stirring the mixed solution with a magnetic stirrer to reflux. Next, 33.06 of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 0.097 g of ethylimidazole was added to obtain an ethylimidazolium carboxylic acid salt-containing Si polymer. The obtained polymer corresponded to a polymer having four types of unit structures of Formula (3-5). The molecular weight Mw of the obtained polymer measured by GPC was found to be 2,400 in terms of polystyrene.

The composition was a composition containing a silane compound containing an anion group and a silane compound containing no anion group in which the silane compound containing an anion group existed in a ratio of 0.1 mol % in the whole silane compounds. In the obtained polymer in which an organic group containing an anion group was bonded to a silicon atom and the anion group had a salt structure, the ratio of the number of repeating units of Si—O having an ethylimidazolium carboxylic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 2

4.98 g of phenyltrimethoxysilane, 67.98 g of tetraethoxysilane, 26.89 g of methyltriethoxysilane, 0.15 g of trimethoxysilylpropyl succinic anhydride, and 150 acetone were charged into a 500 mL flask to be dissolved and the resultant mixed solution was warmed while stirring the mixed solution with a magnetic stirrer to reflux. Next, 33.06 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 0.10 g of triethylamine was added to obtain a triethylammonium carboxylic acid salt-containing Si polymer. The obtained polymer corresponded to a polymer having four types of unit structures of Formula (3-6). The molecular weight Mw of the obtained polymer measured by GPC was found to be 2,400 in terms of polystyrene.

The composition was a composition containing a silane compound containing an anion group and a silane compound containing no anion group in which the silane compound containing an anion group existed in a ratio of 0.1 mol % in the whole silane compounds. In the obtained polymer in which an organic group containing an anion group was bonded to a silicon atom and the anion group had a salt structure, the ratio of the number of repeating units of Si—O having a triethylammonium carboxylic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 3

4.98 g of phenyltrimethoxysilane, 67.98 g of tetraethoxysilane, 26.89 g of methyltriethoxysilane, 0.15 g of trimethoxysilylpropyl succinic anhydride, and 150 g of acetone were charged into a 500 mL flask to be dissolved and the resultant mixed solution was armed while stirring the mixed solution with a magnetic stirrer to reflux. Next, 33.06 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether as added to the reaction solution, and ethanol, water and hydrochloric acid being reaction by-products were distilled off under reduced pressure to obtain a hydrolysis-condensation product. To the hydrolysis-condensation product, 0.080 of pyridine was added to obtain a pyridinium carboxylic acid salt-containing Si polymer. The obtained polymer corresponded to a polymer having four types of unit structures of a (3-7). The molecular weight Mw of the obtained polymer measured by GPC was found to be 2,400 in terms of polystyrene.

The composition was a composition containing a silane compound containing an anion group and a silane compound containing no anion group in which the silane compound containing an anion group existed in a ratio of 0.1 mol % in the whole silane compounds. In the obtained polymer in which an organic group containing an anion group was bonded to a silicon atom and the on group had a salt structure, the ratio of the number of repeating units of Si—O having a pyridinium carboxylic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 4

4.98 g of phenyltrimethoxysilane, 67.98 g of tetraethoxysilane, 26.89 g of methyltriethoxysilane, 0.15 g of trimethoxysilylpropyl succinic anhydride, and 150 g of acetone were charged into a 500 mL flask to be dissolved and the resultant mixed solution was warmed while stirring the mixed solution with a magnetic stirrer to reflux. Next, 33.06 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 0.095 g of trimethylsulfonium hydroxide was added to obtain a trimethylsulfonium carboxylic acid salt-containing Si polymer. The obtained polymer corresponded to a polymer having four types of unit structures of Formula (3-8). The molecular weight Mw of the obtained polymer measured by GPC was found to be 2,400 in terms of polystyrene.

The composition was a composition containing a silane compound containing an anion group and a silane compound containing no anion group in which the silane compound containing an anion group existed in a ratio of 0.1 mol % in the whole silane compounds. In the obtained polymer in which an organic group containing an anion group was bonded to a silicon atom and the anion group had a salt structure, the ratio of the number of repeating units of Si—O having a trimethylsulfonium carboxylic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 5

4.98 g of phenyltrimethoxysilane, 67.98 g of tetraethoxysilane, 26.89 g of methyltriethoxysilane, 0.15 g of trimethoxysilylpropyl succinic anhydride, and 150 g of acetone were charged into a 500 mL flask to be dissolved and the resultant mixed solution was warmed while stirring the mixed solution with a magnetic stirrer to reflux. Next, 33.06 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 0.21 g of benzyltriethylammonium hydroxide was added to obtain a benzyltriethylammonium carboxylic acid salt-containing Si polymer. The obtained polymer corresponded to a polymer having four types of unit structures of Formula (3-17). The molecular weight Mw of the obtained polymer measured by GPC was found to be 2,400 in terms of polystyrene.

The composition was a composition containing a silane compound containing an anion group and a silane compound containing no anion group in which the silane compound containing an anion group existed in a ratio of 0.1 mol % in the whole silane compounds. In the obtained polymer in which an organic group containing an anion group was bonded to a silicon atom and the anion group had a salt structure, the ratio of the number of repeating units of Si—O having a benzyltriethylammonium carboxylic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 6

4.98 g of phenyltrimethoxysilane, 67.98 g of tetraethoxysilane, 26.89 g of methyltriethoxysilane, 0.15 g of trimethoxysilylpropyl succinic anhydride, and 150 g of acetone were charged into a 500 mL flask to be dissolved and the resultant mixed solution was warmed while stirring the mixed solution with a magnetic stirrer to reflux. Next, 33.06 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 0.28 g of triethoxysilylpropyl-4,5-dihydroimidazole was added to obtain a Si polymer in which both an imidazolium cation and a carboxylic acid anion were fixed. The obtained polymer corresponded to a polymer having five types of unit structures of Formula (3-15). The molecular weight Mw of the obtained polymer measured by GPC was found to be 2,400 in terms of polystyrene.

The composition was a composition containing a silane compound containing an anion group and a silane compound containing no anion group in which the silane compound containing an anion group existed in a ratio of 0.1 mol % in the whole silane compounds. In the obtained polymer in which an organic group containing an anion group was bonded to a silicon atom and the anion group had a salt structure, the ratio of the number of repeating units of Si—O having an imidazolium carboxylic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 7

4.98 g of phenyltrimethoxysilane, 67.85 g of tetraethoxysilane, 26.84 of methyltriethoxysilane, 0.10 g of 3-trihydroxysilyl-1-propane sulfonic acid, and 150 g of acetone were charged into a 500 mL flask to be dissolved and the resultant mixed solution was warmed while stirring the mixed solution with a magnetic stirrer to reflux. Next, 32.74 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 0.05 of ethylimidazole was added to obtain an ethylimidazolium sulfonic acid salt-containing Si polymer. The obtained polymer corresponded to a polymer having four types of unit structures of Formula (3-11). The molecular weight Mw of the obtained polymer measured by GPC was found to be 4,500 in terms of polystyrene.

The composition was a composition containing a silane compound containing an anion group and a silane compound containing no anion group in which the silane compound containing an anion group existed in a ratio of 0.1 mol % in the whole silane compounds. In the obtained polymer in which an organic group containing an anion group was bonded to a silicon atom and the anion group had a salt structure, the ratio of the number of repeating units of Si—O having an ethylimidazolium sulfonic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 8

4.98 g of phenyltrimethoxysilane, 67.85 g of tetraethoxysilane, 26.84 g of methyltriethoxysilane, 0.10 g of 3-trihydroxysilyl-1-propane sulfonic acid, and 150 g of acetone were charged into a 500 mL flask to be dissolved and the resultant mixed solution was warmed while stirring the mixed solution with a magnetic stirrer to reflux. Next, 32.74 of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 0.05 g of trimethylsulfonium hydroxide was added to obtain a trimethylsulfonium sulfonic acid salt-containing Si polymer. The obtained polymer corresponded to a polymer having four types of unit structures of Formula (3-12). The molecular weight Mw of the obtained polymer measured by GPC was found to be 4,500 in terms of polystyrene.

The composition was a composition containing a silane compound containing an anion group and a silane compound containing no anion group in which the silane compound containing an anion group existed in a ratio of 0.1 mol % in the whole silane compounds. In the obtained polymer in which an organic group containing an anion group was bonded to a silicon atom and the anion group had a salt structure, the ratio of the number of repeating units of Si—O having a trimethylsulfonium sulfonic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 9

4.91 g of phenyltrimethoxysilane, 66.51 g of tetraethoxysilane, 26.48 g of methyltriethoxysilane, 1.36 g of triphenylsulfonium triethoxysilylpropyl sulfonic acid salt, and 150 g of acetone were charged into a 500 mL flask to be dissolved and the resultant mixed solution was warmed while stirring the mixed solution with a magnetic stirrer to reflux. Next, 32.51 of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. The obtained polymer corresponded to a polymer having four types of unit structures of Formula (3-13). The molecular weight Mw of the obtained polymer measured by GPC was found to be 1,500 in terms of polystyrene.

The composition was a composition containing a silane compound containing an anion group and a silane compound containing no anion group in which the silane compound containing an anion group existed in a ratio of 0.5 mol % in the whole silane compounds. In the obtained polymer in which an organic group containing an anion group was bonded to a silicon atom and the anion group had a salt structure, the ratio of the number of repeating units of Si—O having a triphenylsulfonium sulfonic acid salt to the number of all repeating units of Si—O was 0.5%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 10

4.99 g of phenyltrimethoxysilane, 67.99 g of tetraethoxysilane, 26.90 g of methyltriethoxysilane, 0.17 of tert-butoxyphenylethyltrimethoxysilane, and 150 of acetone were charged into a 500 mL flask to be dissolved and the resultant mixed solution was warmed while stirring the mixed solution with a magnetic stirrer to reflux. Next, 33.07 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 0.05 g of ethylimidazole was added to obtain an ethylimidazolium phenol salt-containing Si polymer. The obtained polymer corresponded to a polymer having four types of unit structures of Formula (3-18). The molecular weight Mw of the obtained polymer measured by GPC was found to be 1,500 in terms of polystyrene.

The composition was a composition containing a silane compound containing an anion group and a silane compound containing no anion group in which the silane compound containing an anion group existed in a ratio of 0.1 mol % in the whole silane compounds. In the obtained polymer in which an organic group containing an anion group was bonded to a silicon atom and the anion group had a salt structure, the ratio of the number of repeating units of Si—O having an ethylimidazolium phenol salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 11

5.00 g of phenyltrimethoxysilane, 67.73 g of tetraethoxysilane, 26.96 g of methyltriethoxysilane, 0.17 g of tert-butoxyphenylethyltrimethoxysilane, 0.10 of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.31 g of nitric acid was dissolved in 32.92 g of ultrapure water was added to the mixed solution. The reaction was carried out for 240 minutes and then the resultant reaction solution was cooled down to room temperature. Then, 200 of propylene glycol monoethyl ether was added to the reaction solution, and ethanol, water and nitric acid being reaction by-products were distilled off under reduced pressure to obtain a hydrolysis-condensation product. The obtained polymer corresponded to a polymer having five types of unit structures of Formula (3-19) in which both an imidazolium cation and a phenol anion were bonded to Si. The molecular weight Mw of the obtained polymer measured by GPC was found to be 1,500 in terms of polystyrene.

The composition was a composition containing a silane compound containing an anion group and a silane compound containing no anion group in which the silane compound containing an anion group existed in a ratio of 0.1 mol % in the whole silane compounds. In the obtained polymer in which an organic group containing an anion group was bonded to a silicon atom and the anion group had a salt structure, the ratio of the number of repeating units of Si—O having an imidazolium phenol salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 12

4.91 g of phenyltrimethoxysilane, 71.21 g of tetraethoxysilane, 22.08 g of methyltriethoxysilane, 0.18 g of tert-butoxynorbornene carboxylic acid trimethoxysilane, 0.14 g of triethoxysilylpropyl-4,5-dihydroimidazole, and 150 g of acetone were charged into a 500 mL flask to be dissolved and the resultant mixed solution was warmed while stirring the mixed solution with a magnetic stirrer to reflux. Next, an aqueous solution in which 0.31 g of nitric acid was dissolved in 32.92 of ultrapure water was added to the mixed solution. The reaction was carried out for 240 minutes and then the resultant reaction solution was cooled down to room temperature. Then, 200 g of propylene glycol monoethyl ether was added to the reaction solution, and both ethanol and methanol, acetone, water and nitric acid being reaction by-products were distilled off under reduced pressure to obtain a hydrolysis-condensation product. The obtained polymer corresponded to a polymer having five types of unit structures of Formula (3-23). The molecular weight Mw of the obtained polymer measured by GPC was found to be 1.300 in terms of polystyrene.

The composition was a composition containing a silane compound containing an anion group and a silane compound containing no anion group in which the silane compound containing an anion group existed in a ratio 0.1 mol % in the whole silane compounds. In the obtained polymer in which an organic group containing an anion group was bonded to a silicon atom and the anion group had a salt structure, the ratio of the number of repeating units of Si—O having an imidazolium carboxylic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 13

4.76 g of phenyltrimethoxysilane, 64.85 g of tetraethoxysilane, 17.13 g of methyltriethoxysilane, 0.14 g of trimethoxysilylpropyl succinic anhydride, 0.13 g of triethoxysilylpropyl-4,5-dihydroimidazole, 12.99 g of bis(trimethoxysilyl)ethane, and 150 g of acetone were charged into a 500 mL flask to be dissolved and the resultant mixed solution was warmed while stirring the mixed solution with a magnetic stirrer to reflux. Next, an aqueous solution in which 0.31 g of nitric acid was dissolved in 32.92 g of ultrapure water was added to the mixed solution. The reaction was carried out for 240 minutes and then the resultant reaction solution was cooled down to room temperature. Then, 200 g of propylene glycol monoethyl ether was added to the reaction solution, and ethanol, water and nitric acid being reaction by-products were distilled off under reduced pressure to obtain a hydrolysis-condensation product. The obtained polymer corresponded to a polymer having six types of unit structures of Formula (3-26) in which both an imidazolium cation and a carboxylic acid anion are bonded to Si. The molecular weight Mw of the obtained polymer measured by GPC was found to be 1,800 in terms of polystyrene.

The composition was a composition containing a silane compound containing an anion group and a slime compound containing no anion group in which the silane compound containing an anion group existed in a ratio of 0.1 mol % in the whole silane compounds. In the obtained polymer in which an organic group containing an anion group was bonded to a silicon atom and the anion group had a salt structure, the ratio of the number of repeating units of Si—O having an imidazolium carboxylic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

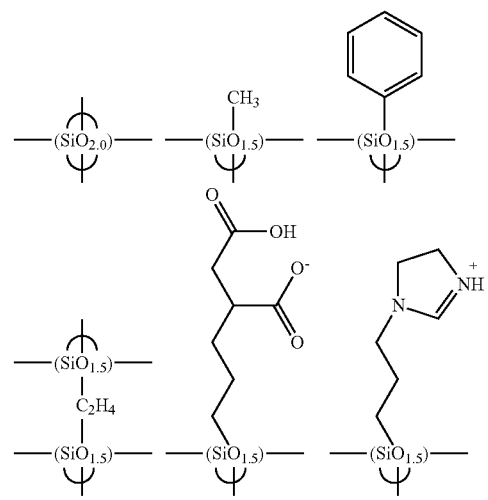

Formula (3-26)

Synthesis Example 14

4.88 g of phenyltrimethoxysilane, 71.75 of tetraethoxysilane, 21.84 g of methyltriethoxysilane, 0.14 g of trimethoxysilylpropyl succinic anhydride, and 150 g of acetone ere charged into a 500 ml flask to be dissolved and the resultant mixed solution was warmed while stirring the mixed solution with a magnetic stirrer. While stirring the mixed solution with a magnetic stirrer, 32.33 g of a 0.01 M hydrochloric acid aqueous solution was added to the mixed solution. Next, the resultant mixed solution was warmed to reflux. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 1.38 g of a 10% by weight triphenylsulfonium hydroxide aqueous solution was added to obtain a triphenylsulfonium carboxylic acid salt-containing Si polymer. The obtained polymer corresponded to a polymer having four types of unit structures of Formula (3-27). The molecular weight Mw of the obtained polymer measured by GPC was found to be 1,500 in terms of polystyrene.

The composition was a composition containing a silane compound containing an anion group and a silane compound containing no anion group in which the silane compound containing an anion group existed in a ratio of 0.1 mol % in the whole silane compounds.

In the obtained polymer in which an organic group containing an anion group was bonded to a silicon atom and the anion group had a salt structure, the ratio of the number of repeating units of Si—O having a sulfonium carboxylic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Synthesis Example 15

4.88 g of phenyltrimethoxysilane, 71.71 g of tetraethoxysilane, 21.83 of methyltriethoxysilane, 0.20 g of a 50% trihydroxysilylpropane sulfonic acid aqueous solution, and 150 g of acetone were charged into a 500 ml flask to be dissolved and the resultant mixed solution was warmed while stirring the mixed solution with a magnetic stirrer to reflux. Next, 32.80 of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 1.38 g of a 10% by weight triphenylsulfonium hydroxide aqueous solution was added to obtain a triphenylsulfonium sulfonic acid salt-containing Si polymer. The obtained polymer corresponded to a polymer having four types of unit structures of Formula (3-28). The molecular weight Mw of the obtained polymer measured by GPC was found to be 1,500 in terms of polystyrene.

The composition was a composition containing a silane compound containing an anion group and a silane compound containing no anion group in which the silane compound containing an anion group existed in a ratio of 0.1 mol % in the whole silane compounds.

In the obtained polymer in which an organic group containing an anion group was bonded to a silicon atom and the anion group had a salt structure, the ratio of the number of repeating units of Si—O having a sulfonium carboxylic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

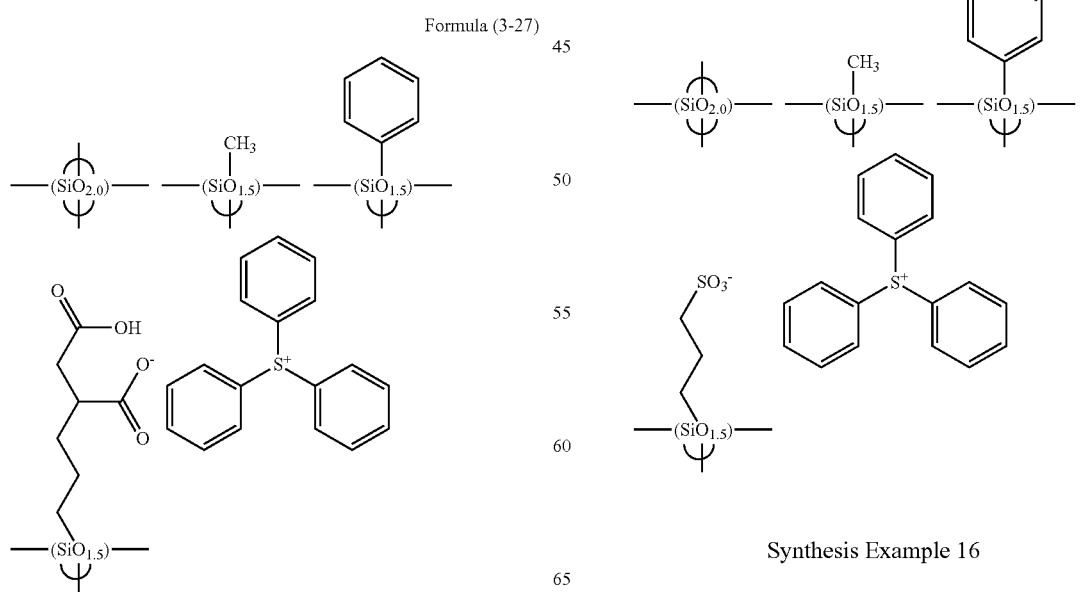

Formula (3-27)

Formula (3-28)

Synthesis Example 16

4.94 g of phenyltrimethoxysilane, 72.71 g of tetraethoxysilane, 22.05 g of methyltriethoxysilane, 0.16 g of 2-diethylphosphate ethyltriethoxysilane, 0.14 g of triethoxysilylpropyl-4,5-dihydroimidazole, and 150 g of acetone were charged into a 500 ml flask to be dissolved and the resultant mixed solution was warmed while stirring the mixed solution with a magnetic stirrer to reflux. Next, an aqueous solution in which 0.16 g of nitric acid was dissolved in 33.22 g of ultrapure water was added to the mixed solution. The reaction was carried out for 240 minutes and then the resultant reaction solution was cooled down to room temperature. Then, 200 g of propylene glycol monoethyl ether was added to the reaction solution, and ethanol, water and nitric acid being reaction by-products were distilled off under reduced pressure to obtain a hydrolysis-condensation product. The obtained polymer corresponded to a polymer having five types of unit structures of Formula (3-29). The molecular weight Mw of the obtained polymer measured by GPC was found to be 1,500 in terms of polystyrene.

The composition was a composition containing a silane compound containing an anion group and a silane compound containing no anion group in which the silane compound containing an anion group existed in a ratio of 0.1 mol % in the whole silane compounds.

In the obtained polymer in which an organic group containing an anion group was bonded to a silicon atom and the anion group had a salt structure, the ratio of the number of repeating units of Si—O having an imidazolium phosphoric acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Formula (3-29)

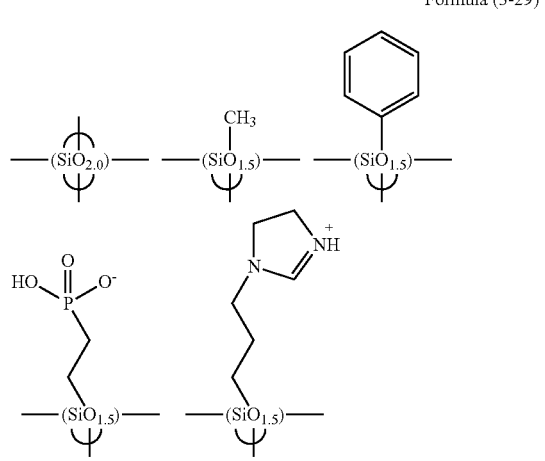

Synthesis Example 7

4.88 g of phenyltrimethoxysilane, 71.74 g of tetraethoxysilane, 21.84 g of methyltriethoxysilane, 0.16 g of 2-diethylphosphate ethyltriethoxysilane, and 150 g of acetone were charged into a 500 ml flask to be dissolved and the resultant mixed solution was warmed while stirring the mixed solution with a magnetic stirrer to reflux. Next, 32.81 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 1.38 g of a 10% by weight triphenylsulfonium hydroxide aqueous solution was added to obtain a triphenylsulfonium sulfonic acid salt-containing Si polymer. The obtained polymer corresponded to a polymer having four types of unit structures of Formula (3-30). The molecular weight Mw of the obtained polymer measured by GPC was found to be 1,500 in terms of polystyrene.

The composition was a composition containing a silane compound containing an anion group and a silane compound containing no anion group in which the silane compound containing an anion group existed in a ratio of 0.1 mol % in the whole silane compounds.

In the obtained polymer in which an organic group containing an anion group was bonded to a silicon atom and the anion group had a salt structure, the ratio of the number of repeating units of Si—O having a sulfonium phosphoric acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Formula (3-30)

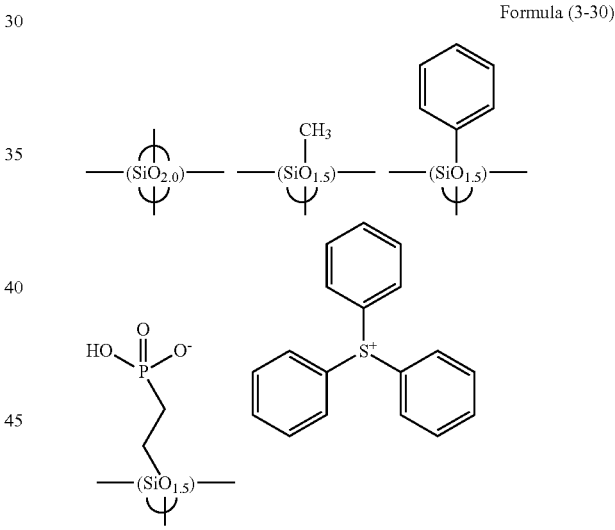

Synthesis Example 18

4.80 g of phenyltrimethoxysilane, 70.71 g of tetraethoxysilane, 17.20 g of methyltriethoxysilane, 0.14 g of trimethoxysilylpropyl succinic anhydride, 5.78 g of mercaptopropyltriethoxysilane, and 150 g of acetone were charged into a 500 ml flask to be dissolved and the resultant mixed solution was warmed while stirring the mixed solution with a magnetic stirrer to reflux. Next, 32.31 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 1.36 g of a 10% by weight triphenylsulfonium hydroxide aqueous solution was added to obtain a triphenylsulfonium succinic acid salt-containing Si polymer. The obtained polymer corresponded to a polymer having five types of unit structures of Formula (3-31). The molecular weight Mw of the obtained polymer measured by GPC was found to be 1,500 in terms of polystyrene.

The composition was a composition containing a silane compound containing an anion group and a silane compound containing no anion group in which the silane compound containing an anion group existed in a ratio of 0.1 mol % in the whole silane compounds.

In the obtained polymer in which an organic group containing an anion group was bonded to a silicon atom and the anion group had a salt structure, the ratio of the number of repeating units of Si—O having a sulfonium succinic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Formula (3-31)

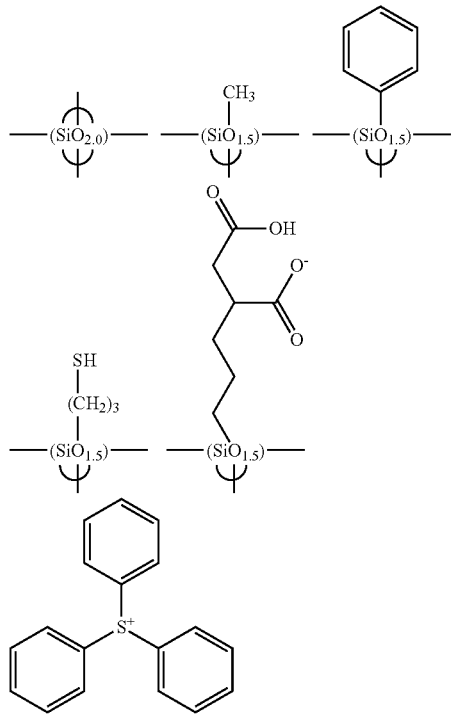

Synthesis Example 19

4.73 of phenyltrimethoxysilane, 69.54 g of tetraethoxysilane, 16.92 g of methyltriethoxysilane, 0.14 g of trimethoxysilylpropyl succinic anhydride, 7.33 g of N-(3-triethoxysilylpropyl)-4-hydroxybutyramide, and 150 g of acetone were charged into a 500 ml flask to be dissolved and the resultant mixed solution was warmed while stirring the mixed solution with a magnetic stirrer to reflux. Next, 31.78 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 1.34 of a 10% by weight triphenylsulfonium hydroxide aqueous solution was added to obtain a triphenylsulfonium succinic acid salt-containing Si polymer. The obtained polymer corresponded to a polymer having five types of unit structures of Formula (3-32). The molecular weight Mw of the obtained polymer measured by GPC was found to be 1,500 in terms of polystyrene.

The composition was a composition containing a silane compound containing an anion group and a slime compound containing no anion group in which the silane compound containing an anion group existed in a ratio of 0.1 mol % in the whole silane compounds.

In the obtained polymer in which an organic group containing an anion group was bonded to a silicon atom and the anion group had a salt structure, the ratio of the number of repeating units of Si—O having a sulfonium succinic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Formula (3-32)

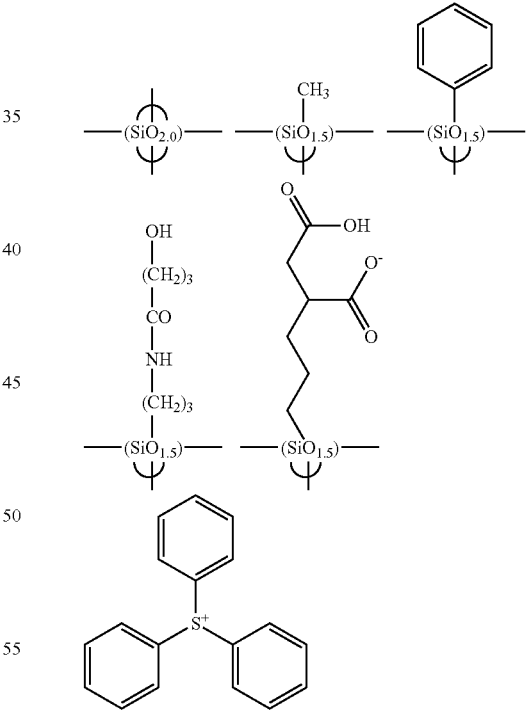

Synthesis Example 20

4.81 g of phenyltrimethoxysilane, 70.74 g of tetraethoxysilane, 17.21 g of methyltriethoxysilane, 0.14 of trimethoxysilylpropyl succinic anhydride, 5.73 g of glycidoxypropyltrimethoxysilane, and 150 g of acetone were charged into a 500 ml flask to be dissolved and the resultant mixed solution was warmed while stirring the mixed solution with a magnetic stirrer to reflux. Next, 32.33 g of a 0.01 M nitric acid aqueous solution was added to the mixed solution. The reaction was carried out for 240 minutes and then the resultant reaction solution was cooled down to room temperature. Then, 200 of propylene glycol monoethyl ether was added to the reaction solution, and ethanol, water and nitric acid being reaction by-products were distilled off under reduced pressure to obtain a hydrolysis-condensation product. To the hydrolysis-condensation product, 1.36 g of a 10% by weight triphenylsulfonium hydroxide aqueous solution was added to obtain a triphenylsulfonium succinic acid salt-containing Si polymer. The obtained polymer corresponded to a polymer having five types of unit structures of Formula (3-33). The molecular weight Mw of the obtained polymer measured by GPC was found to be 1,500 in terms of polystyrene.

The composition was a composition containing a silane compound containing an anion group and a silane compound containing no anion group in which the silane compound containing an anion group existed in a ratio of 0.1 mol % in the whole silane compounds.

In the obtained polymer in which an organic group containing an anion group was bonded to a silicon atom and the anion group had a salt structure, the ratio of the number of repeating units of Si—O having a sulfonium succinic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

methoxysilane, and 150 g of acetone were charged into a 500 ml flask to be dissolved and the resultant mixed solution was warmed while stirring the mixed solution with a magnetic stirrer to reflux. Next, 32.33 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water, and hydrochloric acid being reaction by-products were distilled off under reduced pressure to obtain a hydrolysis-condensation product. To the hydrolysis-condensation product, 1.36 of a 10% by weight triphenylsulfonium hydroxide aqueous solution was added to obtain a triphenylsulfonium succinic acid salt-containing Si polymer. The obtained polymer corresponded to a polymer having five types of unit structures of Formula (3-34). The molecular weight Mw of the obtained polymer measured by GPC was found to be 2,500 in terms of polystyrene.

The composition was a composition containing a silane compound containing an anion group and a silane compound containing no anion group in which the silane compound containing an anion group existed in a ratio of 0.1 mol % in the whole silane compounds.

In the obtained polymer in which an organic group containing an anion group was bonded to a silicon atom and the anion group had a salt structure, the ratio of the number of repeating units of Si—O having a sulfonium succinic acid salt to the number of all repeating units of Si—O was 0.1%. A residue remaining after removing a solvent from the obtained hydrolysis-condensation product solution at 140° C. was defined as a solid content, and with the solid content a 15% by weight solution was prepared with propylene glycol monoethyl ether as the solvent.

Formula (3-33)

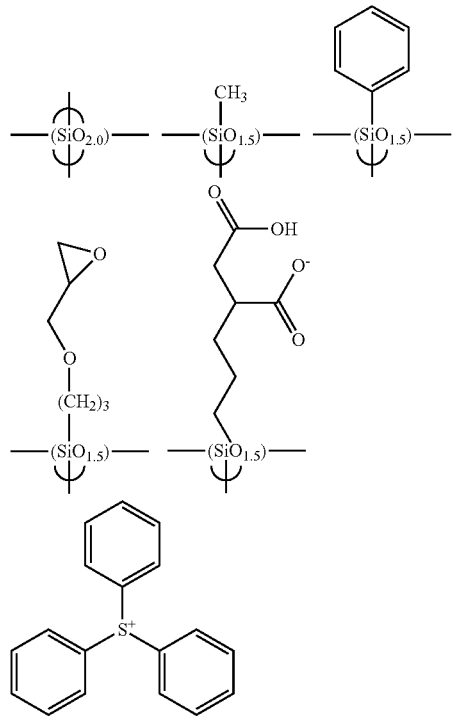

Formula (3-34)

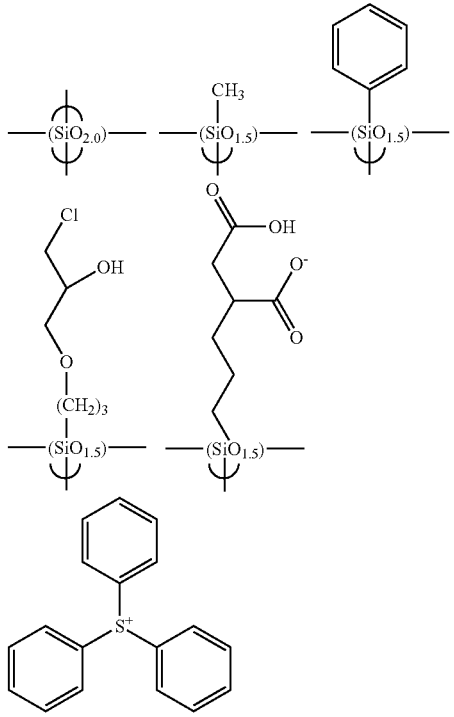

Synthesis Example 21

4.81 g of phenyltrimethoxysilane, 70.74 g of tetraethoxysilane, 17.21 methyltriethoxysilane, 0.14 g of trimethoxysilylpropyl succinic anhydride, 5.73 g of glycidoxypropyltri- Comparative Synthesis Example 1

4.98 g of phenyltrimethoxysilane, 67.98 g of tetraethoxysilane, 26.89 g of methyltriethoxysilane, 0.15 g of trimethoxysilylpropyl succinic anhydride, and 150 g of acetone were charged into a 500 mL flask to be dissolved and the resultant mixed solution was warmed while stirring the mixed solution with a magnetic stirrer to reflux. Next, 33.06 g of a 0.01 M hydrochloric acid aqueous solution was added to the mixed solution. The reaction was carried out for 120 minutes and then the resultant reaction solution was cooled down to room temperature. Then, 200 of propylene glycol monoethyl ether was added to the reaction solution, and ethanol, water and hydrochloric acid being reaction by-products were distilled off under reduced pressure to obtain a hydrolysis-condensation product. The obtained polymer corresponded to a polymer having four types of unit structures of Formula (3-35). The molecular weight Mw of the obtained polymer measured by GPC was found to be 1,400 in terms of polystyrene. A residue remaining after removing a solvent from the obtained hydrolysis-condensation product solution at 140° C. was defined as a solid content, and with the solid content a 15% by weight solution was prepared with propylene glycol monoethyl ether as the solvent.

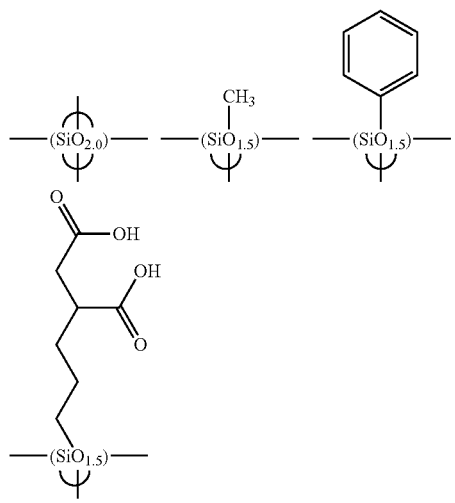

Formula (3-35)

Comparative Synthesis Example 2

4.98 g of phenyltrimethoxysilane, 67.85 g of tetraethoxysilane, 26.84 g of methyltriethoxysilane, 0.10 g of 3-trihydroxysilyl-1-propane sulfonic acid, and 150 g of acetone were charged into a 500 mL flask to be dissolved and the resultant mixed solution was warmed while stirring the mixed solution with a magnetic stirrer to reflux. Next, 32.74 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products ere distilled off under reduced pressure to obtain a hydrolysis-condensation product. The obtained polymer corresponded to a polymer having four types of unit structures of Formula (3-36). The molecular weight Mw of the obtained polymer measured by GPC was found to be 4,500 in terms of polystyrene. A residue remaining after removing a solvent from the obtained hydrolysis-condensation product solution at 140° C. was defined as a solid content, and with the solid content a 15% by weight solution was prepared with propylene glycol monoethyl ether as the solvent.

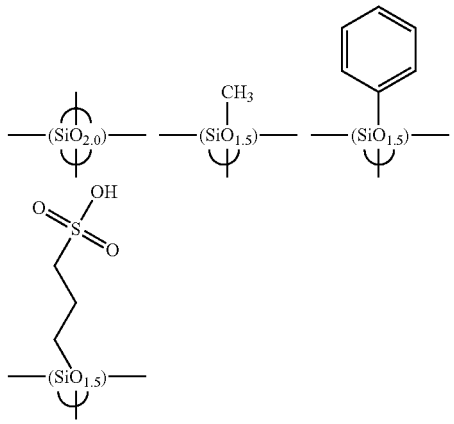

Formula (3-36)

Comparative Synthesis Example 3

4.99 g of phenyltrimethoxysilane, 68.11 g of tetraethoxysilane, 26.90 g of methyltriethoxysilane, and 150 g of acetone were charged into a 500 mL flask to be dissolved and the resultant mixed solution was warmed while stirring the mixed solution with a magnetic stirrer to reflux. Next, 33.08 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol and water being reaction by-products were distilled off under reduced pressure to obtain a hydrolysis-condensation product. The obtained polymer corresponded to a polymer having three types of unit structures of Formula (3-37). The molecular weight of the obtained polymer measured by GPC was found to be 1,700 in terms of polystyrene. A residue remaining after removing a solvent from the obtained hydrolysis-condensation product solution at 140° C. was defined as a solid content, and with the solid content a 15% by weight solution was prepared with propylene glycol monoethyl ether as the solvent.

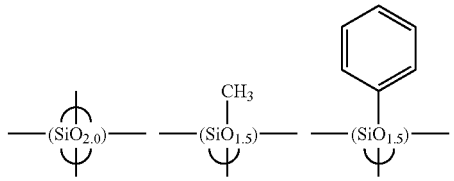

Formula (3-37)

Comparative Synthesis Example 4

4.95 g of phenyltrimethoxysilane, 65.58 g of tetraethoxysilane, 26.73 g of methyltriethoxysilane, 2.74 g of triethoxysilylpropyl-4,5-dihydroimidazole, and 150 g of ethanol were charged into a 500 mL flask to be dissolved and the resultant mixed solution was warmed while stirring the mixed solution with a magnetic stirrer to reflux. Next, a hydrochloric acid aqueous solution in which 5.47 g of hydrochloric acid was dissolved in 32.66 g of ultrapure water was added to the mixed solution. The reaction was carried out for 240 minutes and then the resultant reaction solution was cooled down to room temperature. Then, 200 of propylene glycol monoethyl ether was added to the reaction solution, and ethanol, water and hydrochloric acid being reaction by-products were distilled off under reduced pressure to obtain a hydrolysis-condensation product. The molecular weight Mw of the obtained polymer measured by GPC was found to be 1,500 in terms of polystyrene. The obtained polymer corresponded to a polymer having four types of unit structures of Formula (3-38). In the obtained polymer in which an organic group containing a cation group was bonded to a silicon atom and the cation group had a salt structure, the ratio of the number of repeating units of Si—O having a dihydroimidazolium hydrochloric acid salt to the number of all repeating units of Si—O was 2%. A residue remaining after removing a solvent from the obtained hydrolysis-condensation product solution at 140° C. was defined as a solid content, and with the solid content a 15% by weight solution was prepared with propylene glycol monoethyl ether as the solvent.

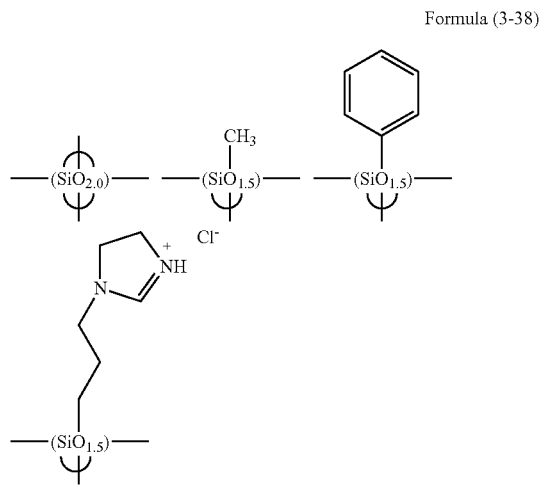

Formula (3-38)

Reference Synthesis Example 1

4.97 g of phenyltrimethoxysilane, 66.79 g of tetraethoxysilane, 26.79 g of methyltriethoxysilane, 1.45 g of trimethoxysilylpropyl succinic anhydride, and 150 g of acetone were charged into a 500 mL flask to be dissolved and the resultant mixed solution was warmed while stirring the mixed solution with a magnetic stirrer to reflux. Next, 31.40 g of a 0.01 M hydrochloric acid aqueous solution was added to the mixed solution. The reaction was carried out for 240 minutes and then the resultant reaction solution was cooled down to room temperature. Then, 200 g of propylene glycol monoethyl ether was added to the reaction solution, and ethanol, water and hydrochloric acid being reaction by-products were distilled off under reduced pressure to obtain a hydrolysis-condensation product. To the hydrolysis-condensation product, 0.96 g of ethylimidazole was added to obtain an ethylimidazolium carboxylic acid salt 2%-containing Si polymer. The obtained polymer corresponded to a polymer having four types of unit structures of Formula (3-5). The molecular eight Mw of the obtained polymer measured by GPC was found to be 4,300 in terms of polystyrene.

The composition was a composition containing a silane compound containing an anion group and a silane compound containing no anion group in which the silane compound containing an anion group existed in a ratio of 1.0 mol % in the whole silane compounds. In the obtained polymer in which an organic group containing an anion group was bonded to a silicon atom and the anion group had a salt structure, the ratio of the number of repeating units of Si—O having an ethylimidazole carboxylic acid salt to the number of all repeating units of Si—O was 1.0%. A residue remaining after removing a solvent from the obtained hydrolysis-condensation product solution at 140° C. was defined as a solid content, and with the solid content a 15% by weight solution was prepared with propylene glycol monoethyl ether as the solvent.

Example 1

To 20 g of the solution (polymer concentration: 15% by mass) obtained in Synthesis Example 1, 0.03 g of maleic acid, 10.46 g of ultrapure water, and 56.24 g of propylene glycol monoethyl ether were added to prepare a resist underlayer film material.

Example 2

To 20 g of the solution (polymer concentration: 15% by mass) obtained in Synthesis Example 2, 0.03 g of maleic acid, 10.46 g of ultrapure water, and 56.24 g of propylene glycol monoethyl ether were added to prepare a resist underlayer film material.

Example 3

To 20 g of the solution (polymer concentration: 15% by mass) obtained in Synthesis Example 3, 0.03 g of maleic acid, 10.46 g of ultrapure water, and 56.24 g of propylene glycol monoethyl ether were added to prepare a resist underlayer film material.

Example 4

To 20 g of the solution (polymer concentration: 15% by mass) obtained in Synthesis Example 4, 0.03 g of maleic acid, 10.46 g of ultrapure water, and 56.24 g of propylene glycol monoethyl ether were added to prepare a resist underlayer film material.

Example 5

To 20 g of the solution (polymer concentration: 15% by mass) obtained in Synthesis Example 5, 0.03 g of maleic acid, 10.46 g of ultrapure water, and 56.24 g of propylene glycol monoethyl ether were added to prepare a resist underlayer film material.

Example 6

To 20 g of the solution (polymer concentration: 15% by mass) obtained in Synthesis Example 6, 0.03 g of maleic acid, 10.46 g of ultrapure water, and 56.24 g of propylene glycol monoethyl ether were added to prepare a resist underlayer film material.

Example 7

To 10 g of the solution (polymer concentration: 15% by mass) obtained in Synthesis Example 7, 10 g of the solution (polymer concentration: 15% by mass) obtained in Reference Synthesis Example 1, 0.03 g of maleic acid, 10.46 g of ultrapure water, and 56.24 g of propylene glycol monoethyl ether were added to prepare a resist underlayer film material.

Example 8

To 10 g of the solution (polymer concentration: 15% by mass) obtained in Synthesis Example 7, 10 g of the solution (polymer concentration: 15% by mass) obtained in Comparative Synthesis Example 4, 0.03 g of maleic acid, 10.46 g of ultrapure water, and 56.24 g of propylene glycol monoethyl ether were added to prepare a resist underlayer film material.

Example 9

To 10 g of the solution (polymer concentration: 15% by mass) obtained in Synthesis Example 8, 10 g of the solution (polymer concentration: 15% by mass) obtained in Reference Synthesis Example 1, 0.03 g of maleic acid, 10.46 g of ultrapure water, and 56.24 g of propylene glycol monoethyl ether were added to prepare a resist underlayer film material.

Example 10

To 10 g of the solution (polymer concentration: 15% by mass) obtained in Synthesis Example 8, 10 g of the solution (polymer concentration: 15% by mass) obtained in Comparative Synthesis Example 4, 0.03 g of maleic acid, 10.46 g of ultrapure water, and 56.24 g of propylene glycol monoethyl ether were added to prepare a resist underlayer film material.

Example 11

To 10 g of the solution (polymer concentration: 15% by mass) obtained in Synthesis Example 9, 10 g of the solution (polymer concentration: 15% by mass) obtained in Reference Synthesis Example 1, 0.03 g of maleic acid, 10.46 g of ultrapure water, and 56.24 g of propylene glycol monoethyl ether were added to prepare a resist underlayer film material.

Example 12

To 10.0 g of the solution (polymer concentration: 15% by mass) obtained in Synthesis Example 9, 10.0 g of the solution (polymer concentration: 15% by mass) obtained in Comparative Synthesis Example 4, 0.03 g of maleic acid, 10.46 g of ultrapure water, and 56.24 g of propylene glycol monoethyl ether were added to prepare a resist underlayer film material.

Example 13

To 20 g of the solution (polymer concentration: 15% by mass) obtained in Synthesis Example 10, 0.03 g of maleic acid, 10.46 g of ultrapure water, and 56.24 g of propylene glycol monoethyl ether were added to prepare a resist underlayer film material.

Example 14

To 20 g of the solution (polymer concentration: 15% by mass) obtained in Synthesis Example 11, 0.03 g of maleic acid, 10.46 g of ultrapure water, and 56.24 g of propylene glycol monoethyl ether were added to prepare a resist underlayer film material.

Example 15

To 20 g of the solution (polymer concentration: 15% by mass) obtained in Synthesis Example 12, 0.03 g of maleic acid, 10.46 g of ultrapure water, and 56.24 g of propylene glycol monoethyl ether were added to prepare a resist underlayer film material.

Example 16

To 20 g of the solution (polymer concentration: 15% by mass) obtained in Synthesis Example 13, 0.03 g of maleic acid, 10.46 g of ultrapure water, and 56.24 g of propylene glycol monoethyl ether were added to prepare a resist underlayer film material.

Example 17

To 20 g of the solution (polymer concentration: 15° A by mass) obtained in Synthesis Example 14, 0.03 g of maleic acid, 10.46 g of ultrapure water, and 56.24 g of propylene glycol monoethyl ether were added to prepare a resist underlayer film material.

Example 18

To 10 of the solution (polymer concentration: 15% by mass) obtained in Synthesis Example 15, 10 g of the solution (polymer concentration: 15% by mass) obtained in Reference Synthesis Example 1, 0.03 g of maleic acid, 10.46 g of ultrapure water, and 56.24 g of propylene glycol monoethyl ether were added to prepare a resist underlayer film material.

Example 19

To 10 g of the solution (polymer concentration: 15% by mass) obtained in Synthesis Example 15, 10 g of the solution (polymer concentration: 15% by mass) obtained in Comparative Synthesis Example 4, 0.03 g of maleic acid, 10.46 g of ultrapure water, and 56.24 g of propylene glycol monoethyl ether were added to prepare a resist underlayer film material.

Example 20

To 20 g of the solution (polymer concentration: 15% by mass) obtained in Synthesis Example 16, 0.03 of maleic acid, 10.46 g of ultrapure water, and 56.24 g of propylene glycol monoethyl ether were added to prepare a resist underlayer film material.

Example 21

To 10 g of the solution (polymer concentration: 15% by mass) obtained in Synthesis Example 17, 10 g of the solution (polymer concentration: 15% by mass) obtained in Reference Synthesis Example 1, 0.03 g of maleic acid, 10.46 g of ultrapure water, and 56.24 g of propylene glycol monoethyl ether were added to prepare a resist underlayer film material.

Example 22

To 10 g of the solution (polymer concentration: 15% by mass) obtained in Synthesis Example 17, 10 g of the solution (polymer concentration: 15% by mass) obtained in Comparative Synthesis Example 4, 0.03 g of maleic acid, 10.46 g of ultrapure water, and 56.24 g of propylene glycol monoethyl ether were added to prepare a resist underlayer film material.

Example 23

To 20 g of the solution (polymer concentration: 15% by mass) obtained in Synthesis Example 18, 0.03 g of maleic acid, 10.46 of ultrapure water, and 56.24 g of propylene glycol monoethyl ether were added to prepare a resist underlayer film material.

Example 24

To 20 of the solution (polymer concentration: 15% by mass) obtained in Synthesis Example 19, 0.03 g of maleic acid, 10.46 of ultrapure water, and 56.24 g of propylene glycol monoethyl ether were added to prepare a resist underlayer film material.

Example 25

To 20 g of the solution (polymer concentration: 15% by mass) obtained in Synthesis Example 20, 0.03 g of maleic acid, 10.46 g of ultrapure water, and 56.24 g of propylene glycol monoethyl ether were added to prepare a resist underlayer film material.

Example 26

To 20 g of the solution (polymer concentration: 15% by mass) obtained in Synthesis Example 21, 0.03 g of maleic acid, 10.46 g of ultrapure water, and 56.24 g of propylene glycol monoethyl ether were added to prepare a resist underlayer film material.

Comparative Example 1

To 20 g of the solution (polymer concentration: 15% by mass) obtained in Comparative Synthesis Example 1, 0.03 g of maleic acid, 10.46 g of ultrapure water, and 56.24 g of propylene glycol monoethyl ether were added to prepare a resist underlayer film material.

Comparative Example 2

To 20 g of the solution (polymer concentration: 15% by mass) obtained in Comparative Synthesis Example 2, 0.03 g of maleic acid, 10.46 g of ultrapure water, and 56.24 g of propylene glycol monoethyl ether were added to prepare a resist underlayer film material.

Comparative Example 3

To 20 g of the solution (polymer concentration: 15% by mass) obtained in Comparative Synthesis Example 3, 0.03 g of maleic acid, 10.46 g of ultrapure water, and 56.24 g of propylene glycol monoethyl ether were added to prepare a resist underlayer film material.

Comparative Example 4

To 20 g of the solution (polymer concentration: 15% by mass) obtained in Comparative Synthesis Example 4, 0.03 g of maleic acid, 10.46 g of ultrapure water, and 56.24 g of propylene glycol monoethyl ether were added to prepare a resist underlayer film material.

Reference Example 1

To 20 g of the solution (polymer concentration: 15% by mass) obtained in Reference Synthesis Example 1, 0.03 g of maleic acid, 10.46 g of ultrapure water, and 56.24 g of propylene glycol monoethyl ether were added to prepare a resist underlayer film material.

(Evaluation of Solvent Resistance)

The resist underlayer film material was applied on a silicon wafer by a spin coating method and was baked on a hot plate at 150° C. for 1 minute. Then, the resist underlayer film material was immersed in propylene glycol monomethyl ether acetate for 1 minute. When the change in the film thickness of the coating film between before and after the immersion was 1 nm or less, the evaluation was made as "advantageous (A)".

TABLE 1

Result of solvent resistance test

| | Solvent resistance |
|---|---|
| Example 1 | A |
| Example 2 | A |
| Example 3 | A |
| Example 4 | A |
| Example 5 | A |
| Example 6 | A |
| Example 7 | A |
| Example 8 | A |
| Example 9 | A |
| Example 10 | A |
| Example 11 | A |
| Example 12 | A |
| Example 13 | A |
| Example 14 | A |
| Example 15 | A |
| Example 16 | A |
| Example 17 | A |
| Example 18 | A |
| Example 19 | A |
| Example 20 | A |
| Example 21 | A |
| Example 22 | A |
| Example 23 | A |
| Example 24 | A |
| Example 25 | A |
| Example 26 | A |
| Comparative Example 1 | B (no good) |
| Comparative Example 2 | B (no good) |
| Comparative Example 3 | B (no good) |
| Comparative Example 4 | A |
| Reference Example 1 | A |

<Optical Constants>

The resist underlayer film solution was applied on a silicon wafer using a spinner. The solution was heated on a hot plate at 240° C. for 1 minute to form a resist underlayer film (film thickness: 0.09 μm). Then, the refractive index (n value) and the optical absorptivity (k value; also called the attenuation coefficient) at a wavelength of 193 nm of the resist underlayer film were measured using a spectro-ellipsometer (VUV-VASE VU-302; manufactured by J. A. Woollam Corporation). The result of the measurement is shown in Table 2.

TABLE 2

Refractive index n and optical absorptivity k

| | Refractive index n (wavelength 193 nm) | Optical absorptivity k (wavelength 193 nm) |
|---|---|---|
| Example 1 | 1.63 | 0.13 |
| Example 2 | 1.63 | 0.13 |
| Example 3 | 1.61 | 0.11 |
| Example 4 | 1.63 | 0.14 |
| Example 5 | 1.63 | 0.14 |

TABLE 2-continued

Refractive index n and optical absorptivity k

| | Refractive index n (wavelength 193 nm) | Optical absorptivity k (wavelength 193 nm) |
|---|---|---|
| Example 6 | 1.63 | 0.14 |
| Example 7 | 1.63 | 0.14 |
| Example 8 | 1.63 | 0.14 |
| Example 9 | 1.63 | 0.14 |
| Example 10 | 1.63 | 0.13 |
| Example 11 | 1.63 | 0.13 |
| Example 12 | 1.63 | 0.16 |
| Example 13 | 1.63 | 0.13 |
| Example 14 | 1.63 | 0.13 |
| Example 15 | 1.63 | 0.13 |
| Example 16 | 1.63 | 0.13 |
| Example 17 | 1.63 | 0.13 |
| Example 18 | 1.63 | 0.13 |
| Example 19 | 1.63 | 0.13 |
| Example 20 | 1.63 | 0.13 |
| Example 21 | 1.63 | 0.13 |
| Example 22 | 1.63 | 0.13 |
| Example 23 | 1.63 | 0.13 |
| Example 24 | 1.63 | 0.13 |
| Example 25 | 1.63 | 0.13 |
| Example 26 | 1.63 | 0.13 |
| Comparative Example 1 | 1.63 | 0.13 |
| Comparative Example 2 | 1.63 | 0.14 |
| Comparative Example 3 | 1.60 | 0.12 |
| Comparative Example 4 | 1.63 | 0.14 |
| Reference Example 1 | 1.63 | 0.14 |

<Measurement of Dry Etching Rate>

Etchers and etching gases used in the measurement of dry etching rates are as follows.
ES401 (manufactured by Nippon Scientific Co., Ltd.): $CF_4$
RIE-10NR (manufactured by Samco, Inc.): $O_2$ Each of the solutions of resist underlayer film forming compositions prepared in Example 1 to Example 26, Comparative Example 1 to Comparative Example 4, and Reference Example 1 was applied on a silicon wafer using a spinner. The composition solution was heated on a hot plate at 240° C. for 1 minute to form a resist underlayer film (film thickness: 0.20 μm ($CF_4$ gas); 0.08 μm ($O_2$ gas)). In the same manner, a photoresist solution (trade name: UV 113; manufactured by Shipley Company, L.L.C.) was applied onto a silicon wafer using a spinner to form a coating film. Using $CF_4$ gas and $O_2$ gas as the etching gas, the dry etching rate was measured. Then, the dry etching rate of each of the resist underlayer films of Example 1 to Example 26, Comparative Example 1 to Comparative Example 4, and Reference Example 1 was compared with that of the resist film. The result is shown in Table 2. The rate ratio is a dry etching rate ratio of (resist underlayer film)/(resist).

TABLE 3

Dry etching rate ratio

| | $CF_4$ (Resist ratio) | $O_2$ (Resist ratio) |
|---|---|---|
| Example 1 | 1.70 | 0.01 |
| Example 2 | 1.74 | 0.02 |
| Example 3 | 1.74 | 0.02 |
| Example 4 | 1.70 | 0.01 |
| Example 5 | 1.70 | 0.01 |
| Example 6 | 1.67 | 0.01 |
| Example 7 | 1.67 | 0.02 |
| Example 8 | 1.67 | 0.02 |
| Example 9 | 1.67 | 0.02 |
| Example 10 | 1.67 | 0.02 |
| Example 11 | 1.67 | 0.02 |
| Example 12 | 1.67 | 0.02 |
| Example 13 | 1.66 | 0.01 |
| Example 14 | 1.66 | 0.01 |
| Example 15 | 1.66 | 0.01 |
| Example 16 | 1.67 | 0.01 |
| Example 17 | 1.66 | 0.01 |
| Example 18 | 1.66 | 0.01 |
| Example 19 | 1.66 | 0.01 |
| Example 20 | 1.66 | 0.01 |
| Example 21 | 1.66 | 0.01 |
| Example 22 | 1.66 | 0.01 |
| Example 23 | 1.66 | 0.01 |
| Example 24 | 1.66 | 0.01 |
| Example 25 | 1.66 | 0.01 |
| Example 26 | 1.66 | 0.01 |
| Comparative Example 1 | 1.80 | 0.02 |
| Comparative Example 2 | 1.85 | 0.02 |
| Comparative Example 3 | 1.75 | 0.03 |
| Comparative Example 4 | 1.66 | 0.01 |
| Reference Example 1 | 1.77 | 0.02 |

<Preparation of Organic Underlayer Film>

30 g of 2-vinylnaphthalene, 3.5 g of glycidyl methacrylate, and 4.5 g of 1-butoxyethyl methacrylate were dissolved in 112 g of cyclohexanone in a flask and then the inside of the flask was purged with nitrogen to heat the resultant reaction mixture to 60° C. After heating, 1.9 g of azobisisobutyronitrile dissolved in 48 g of cyclohexanone was added to the reaction mixture under a pressure pressurized with nitrogen and the resultant reaction mixture was subjected to the reaction at 60° C. for 24 hours. The reaction solution was cooled down and was then charged into methanol to reprecipitate a polymer that was dried by heating to obtain a polymer of Formula (3-39). The weight average molecular weight Mw of the obtained polymer was 12,000 (in terms of polystyrene). When in Formula (3-39), all repeating units were assumed to be 1.0, a repeating unit containing 2-vinylnaphthalene was 0.8, a repeating unit containing glycidyl methacrylate was 0.1, and a repeating unit containing 1-buthoxyethyl methacrylate was 0.1.

With 5 g of the obtained polymer, 0.03 g of MEGAFACE R-30 (trade name; manufactured by Dainippon Ink and Chemicals. Inc.) as a surfactant was mixed and the resultant mixture as dissolved in 23 g of cyclohexanone and 23 of propylene glycol monomethyl ether to prepare a solution. Then, the resultant solution was filtered using a polyethylene microfilter having a pore diameter of 0.10 μm and was further filtered using a polyethylene microfilter having a pore diameter of 0.05 μm to prepare a solution of a resist underlayer film forming composition to be used for a lithography process by a multilayer Formula (3-39)

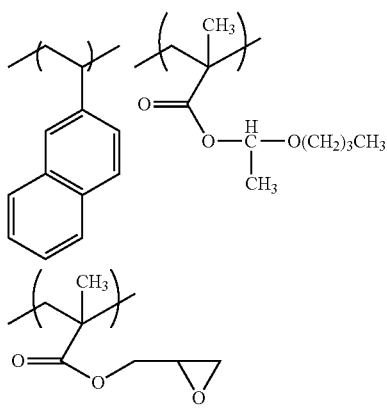

<Resist Patterning Evaluation 1>

The organic underlayer film (layer A) forming composition prepared as described above was applied on a silicon wafer and the composition was heated on a hot plate at 240° C. for 1 minute to obtain an organic underlayer film (layer A) having a film thickness of 250 nm. On the organic underlayer film, each of the Si-containing anti-reflective coating (layer B) compositions obtained in Example 1 to Example 26, Comparative Example 1 to Comparative Example 4, and Reference Example 1 was applied and the composition was heated on a hot plate at 240° C. for 1 minute to obtain a Si-containing anti-reflective coating (layer B) having a film thickness of 40 nm. On the anti-reflective coating, a commercially available photoresist solution (trade name: PAR 855; manufactured by Sumitomo Chemical Co. Ltd.) was applied by a spinner and the solution was heated on a hot plate at 100° C. for minute to form a photoresist film (layer C) having a film thickness of 150 nm. The patterning of the resist was performed using an exposing machine (S307E scanner; manufactured by Nikon Corporation; wavelength: 193 nm, NA, σ: 0.85, 0.93/0.85 (Annular)). The target was a photoresist after the development having a line width and a width between lines both of 0.08 μm, which is so-called line and space (dense line), and the exposure was performed through a ask set to have 9 lines. Then, the resist pattern was baked on a hot plate at 105° C. for 60 seconds, was cooled down, and was then developed with a 2.38% tetramethylammonium hydroxide developer.

With respect to the resist pattern skirt shape after the lithography was performed, a shape having a straight line was evaluated as "perpendicular shape", a shape having a tapering of bottom portion was evaluated as "undercut", and a shape having a spreading of bottom portion was evaluated as "footing".

TABLE 4

| Resist shape evaluation | |
|---|---|
| | Resist skirt shape |
| Example 1 | Perpendicular shape |
| Example 2 | Perpendicular shape |
| Example 3 | Perpendicular shape |
| Example 4 | Perpendicular shape |
| Example 5 | Perpendicular shape |
| Example 6 | Perpendicular shape |
| Example 7 | Perpendicular shape |
| Example 8 | Perpendicular shape |
| Example 9 | Perpendicular shape |
| Example 10 | Perpendicular shape |
| Example 11 | Perpendicular shape |
| Example 12 | Perpendicular shape |
| Example 13 | Perpendicular shape |
| Example 14 | Perpendicular shape |
| Example 15 | Perpendicular shape |
| Example 16 | Perpendicular shape |
| Example 17 | Perpendicular shape |
| Example 18 | Perpendicular shape |
| Example 19 | Perpendicular shape |
| Example 20 | Perpendicular shape |
| Example 21 | Perpendicular shape |
| Example 22 | Perpendicular shape |
| Example 23 | Perpendicular shape |
| Example 24 | Perpendicular shape |
| Example 25 | Perpendicular shape |
| Example 26 | Perpendicular shape |
| Comparative Example 1 | Undercut shape |
| Comparative Example 2 | Pattern collapse |
| Comparative Example 3 | Undercut shape |
| Comparative Example 4 | Footing shape |
| Reference Example 1 | Perpendicular shape |

<Resist Patterning Evaluation 2>

The organic underlayer film (layer A) forming composition obtained as described above was applied on a silicon wafer and the composition was heated on a hot plate at 240° C. for 1 minute to obtain an organic underlayer film (layer A) having a film thickness of 250 nm. On the organic underlayer film, each of the Si-containing anti-reflective coating (layer B) compositions obtained in Example 1 to Example 26, Comparative Example 1 to Comparative Example 4, and Reference Example 1 was applied and the composition was heated on a hot plate at 240° C. for 1 minute to obtain a Si-containing anti-reflective coating (layer B) having a film thickness of 40 nm. On the Si-containing anti-reflective coating, a commercially available photoresist solution (trade name: PAR 855; manufactured by Sumitomo Chemical Co., Ltd.) was applied by a spinner and the solution was heated on a hot plate at 100° C. for 1 minute to form a photoresist film (layer C) having a film thickness of 150 nm. The patterning of the resist was performed using an immersion exposing machine (TWIN-SCAN XT 1900Gi scanner; manufactured by ASML Holding N.V.; wavelength: 193 nm, NA, σ: 1.20, 0.94/0.74 (C-quad), immersion liquid: water). The target was a photoresist after the development having a line width and a width between lines both of 0.05 μm, which is so-called line and space (dense line), and the exposure was performed through a mask set to have 15 lines. Then, the resist pattern was baked on a hot plate at 105° C. for 60 seconds, was cooled down, and was then developed with a 2.38% tetramethylammonium hydroxide developer.

With respect to the resist pattern skirt shape after the lithography was performed, a shape having a straight line was evaluated as "perpendicular shape" and a shape having a tapering of bottom portion and a shape having a spreading of bottom portion were evaluated as "undercut" and "footing" respectively.

TABLE 5

Resist shape evaluation

| | Resist skirt shape |
|---|---|
| Example 1 | Perpendicular shape |
| Example 2 | Perpendicular shape |
| Example 3 | Perpendicular shape |
| Example 4 | Perpendicular shape |
| Example 5 | Perpendicular shape |
| Example 6 | Perpendicular shape |
| Example 7 | Perpendicular shape |
| Example 8 | Perpendicular shape |
| Example 9 | Perpendicular shape |
| Example 10 | Perpendicular shape |
| Example 11 | Perpendicular shape |
| Example 12 | Perpendicular shape |
| Example 13 | Perpendicular shape |
| Example 14 | Perpendicular shape |
| Example 15 | Perpendicular shape |
| Example 16 | Perpendicular shape |
| Example 17 | Perpendicular shape |
| Example 18 | Perpendicular shape |
| Example 19 | Perpendicular shape |
| Example 20 | Perpendicular shape |
| Example 21 | Perpendicular shape |
| Example 22 | Perpendicular shape |
| Example 23 | Perpendicular shape |
| Example 24 | Perpendicular shape |
| Example 25 | Perpendicular shape |
| Example 26 | Perpendicular shape |
| Comparative Example 1 | Undercut shape |
| Comparative Example 2 | Pattern collapse |
| Comparative Example 3 | Undercut shape |
| Comparative Example 4 | Footing shape |
| Reference Example 1 | Partial footing |

<Resist Patterning Evaluation 3 (Film Thickness Dependency)>

The organic underlayer film (layer A) forming composition obtained as described above was applied on a silicon wafer and the composition was heated on a hot plate at 240° C. for 1 minute to obtain an organic underlayer film (layer A) having a film thickness of 250 nm. On the organic underlayer film, the Si-containing anti-reflective coating (layer B) composition obtained in Example 1 was applied and the composition was heated on a hot plate at 240'C for 1 minute to obtain Si-containing anti-reflective coatings (layer B) each having a film thickness of 40 nm, 80 nm, and 160 nm. On the Si-containing anti-reflective coating, a commercially available photoresist solution (trade name: PAR 855; manufactured by Sumitomo Chemical Co., Ltd.) was applied by a spinner and the solution was heated on a hot plate at 100° C. for 1 minute to form a photoresist film (layer C) having a film thickness of 150 nm. The patterning of the resist was performed using an exposing machine (S307E scanner; manufactured by Nikon Corporation; wavelength: 193 nm, NA, σ: 0.85, 0.93/0.85 (Annular)). The target was a photoresist after the development having a line width and a width between lines both of 0.08 μm, which is so-called line and space (dense line), and the exposure performed through a mask set to have 9 lines. Then, the resist pattern was baked on a hot plate at 105° C. for 60 seconds, was cooled down, and was then developed with a 2.38% tetramethylammonium hydroxide developer.

With respect to the resist pattern skirt shape after the lithography was performed, a shape having a straight line was evaluated as "perpendicular shape" and a shape having a tapering of bottom portion and a shape having a spreading of bottom portion were evaluated as "undercut" and "footing" respectively.

TABLE 6

Resist shape evaluation

| | Resist skirt shape |
|---|---|
| Example 1 (40 nm) | Perpendicular shape |
| Example 1 (80 nm) | Perpendicular shape |
| Example 1 (160 nm) | Perpendicular shape |

By adding an amine or an ammonium hydroxide to a Si polymer having a carboxylic acid skeleton or a phenol skeleton, there can be obtained a Si polymer in which a carboxylic acid salt skeleton or a phenol salt skeleton is formed and that exhibits high thermal-curability. The Si polymer having a carboxylic acid salt skeleton or a phenol salt skeleton exhibits the effect even by introducing 0.1% of the skeleton, so that the adjustment of the resist shape, while maintaining an advantageous etching selectivity required for the Si-containing anti-reflective coating, becomes possible. On the other hand, by adding an amine or an ammonium hydroxide to a Si polymer having a sulfonic acid anion or a phosphonic acid anion, the Si polymer becomes a Si polymer having a thermoacid generating function in which a sulfonic acid salt skeleton or a phosphonic acid salt skeleton is formed. By adding a sulfonium hydroxide to the polymer, a polymer having a photoacid generating function can be obtained. Although a Si polymer to which a sulfonic acid salt skeleton or a phosphonic acid skeleton is bonded itself causes a pattern collapse of the resist, by using such a Si polymer in combination with an ammonium salt-containing Si polymer or a sulfonium salt-containing Si polymer having a thermocuring function, an advantageous resist shape can be provided. The Si polymer having a sulfonic acid salt skeleton or a phosphonic acid salt skeleton exhibits the effect even by introducing 0.1% of the skeleton, so that the adjustment of the resist shape, while maintaining an advantageous etching selectivity required for the Si-containing anti-reflective coating, becomes possible. Particularly, such a polymer in which an organic salt skeleton such as a carboxylic acid anion, a phenol anion, a sulfonic acid anion, and a phosphonic acid anion is bonded to a Si polymer has such a characteristic that the resist shape is difficult to change by a film thickness change.

INDUSTRIAL APPLICABILITY

The present invention is applicable as a resist underlayer film forming composition for lithography capable of being used in the production of semiconductor devices, more specifically as a resist underlayer film forming composition for lithography for forming a resist underlayer film capable of being used as a hardmask.

The invention claimed is:

1. A production method of a semiconductor device, comprising:
applying a resist underlayer film forming composition comprising a silane compound containing an anion group, onto a semiconductor substrate and baking the composition to form a resist underlayer film;
wherein the silane compound containing an anion group is a hydrolyzable organosilane in which an organic group containing an anion group is bonded to a silicon atom and the anion group forms a salt structure, a hydrolysis product thereof, or a hydrolysis-condensation product thereof, wherein the hydrolyzable organosilane is represented by Formula (1):

$$R^1_a R^2_b Si(R^3)_{4-(a+b)} \quad \text{Formula (1)}$$

where R¹ is an anion group or an organic group containing an anion group and is bonded to a silicon atom through a Si—C bond; R² is an alkyl group, an aryl group, a halogenated alkyl group, a halogenated aryl group, an alkenyl group, or an organic group having an epoxy group, an acryloyl group, a methacryloyl group, a mercapto group, or a cyano group and is bonded to a silicon atom through a Si—C bond; R³ is an alkoxy group, an acyloxy group, or a halogen group; a is an integer of 1 or 2; b is an integer of 0 or 1; and a+b is an integer of 1 or 2;

applying a composition for a resist onto the resist underlayer film to form a resist film;
  exposing the resist film to light;
  developing the resist after the exposure to obtain a resist pattern;
  etching the resist underlayer film using the resist pattern as a protecting film; and
  processing the semiconductor substrate using the patterned resist and the patterned resist underlayer film.

2. A production method of a semiconductor device, comprising:
  forming an organic underlayer film on a semiconductor substrate;
  applying a resist underlayer film forming composition comprising a silane compound containing an anion group onto the organic underlayer film and baking the composition to form a resist underlayer film;
  wherein the silane compound containing an anion group is a hydrolyzable organosilane in which an organic group containing an anion group is bonded to a silicon atom and the anion group forms a salt structure, a hydrolysis product thereof, or a hydrolysis-condensation product thereof, wherein the hydrolyzable organosilane is represented by Formula (1):

$$R^1{}_a R^2{}_b Si(R^3)_{4-(a+b)} \qquad \text{Formula (1)}$$

where R¹ is an anion group or an organic group containing an anion group and is bonded to a silicon atom through a Si—C bond; R² is an alkyl group, an aryl group, a halogenated alkyl group, a halogenated aryl group, an alkenyl group, or an organic group having an epoxy group, an acryloyl group, a methacryloyl group, a mercapto group, or a cyano group and is bonded to a silicon atom through a Si—C bond; R³ is an alkoxy group, an acyloxy group, or a halogen group; a is an integer of 1 or 2; b is an integer of 0 or 1; and a+b is an integer of 1 or 2;

applying a composition for a resist on the resist underlayer film to form a resist film;
  exposing the resist film to light;
  developing the resist after the exposure to obtain a resist pattern;
  etching the resist underlayer film according to the resist pattern;
  etching the organic underlayer film using the patterned resist underlayer film as a protecting film; and
  processing the semiconductor substrate using the patterned organic underlayer film as a protecting film.

* * * * *